US012684733B2

(12) United States Patent
Yuan et al.

(10) Patent No.: US 12,684,733 B2
(45) Date of Patent: Jul. 14, 2026

(54) LIQUID COOLING SYSTEMS USING CYLINDER ACTUATOR FOR HIGH-PERFORMANCE COMPUTING SYSTEMS

(71) Applicant: Apollo Autonomous Driving USA LLC, Sunnyvale, CA (US)

(72) Inventors: Baoping Yuan, Sunnyvale, CA (US); Kenneth Yu-Kai Chan, Sunnyvale, CA (US); Yongqiang Wang, Sunnyvale, CA (US); Hang Zhao, Sunnyvale, CA (US); Yaoming Shen, Sunnyvale, CA (US)

(73) Assignee: Apollo Autonomous Driving USA LLC, Sunnyvale, CA (US)

( * ) Notice: Subject to any disclaimer, the term of this patent is extended or adjusted under 35 U.S.C. 154(b) by 452 days.

(21) Appl. No.: 18/512,895

(22) Filed: Nov. 17, 2023

(65) Prior Publication Data

US 2025/0169038 A1 May 22, 2025

(51) Int. Cl.
*H05K 7/20* (2006.01)

(52) U.S. Cl.
CPC ..... *H05K 7/20281* (2013.01); *H05K 7/20263* (2013.01); *H05K 7/20272* (2013.01); *H05K 7/20845* (2013.01)

(58) Field of Classification Search
None
See application file for complete search history.

(56) References Cited

U.S. PATENT DOCUMENTS 6,354,341 B1* 3/2002 Saveliev .............. B67D 1/1455
141/2
7,864,527 B1* 1/2011 Whitted ............. H05K 7/20736
165/104.33

(Continued)

FOREIGN PATENT DOCUMENTS

CA 3040034 A1 * 4/2018 ........... H05K 7/1498
CA 3040050 A1 * 4/2018 ......... H05K 7/20781

(Continued)

OTHER PUBLICATIONS

Shahi et al., "A Comparative Study of Energy Savings in a Liquid-Cooled Server by Dynamic Control of Coolant Flow Rate at Server Level", IEEE Transactions on Components, Packaging and Manufacturing Technology, vol. 11, No. 4, Apr. 2021. (Year: 2021).*

(Continued)

*Primary Examiner* — Mohammad Ali
*Assistant Examiner* — Kelvin Booker
(74) *Attorney, Agent, or Firm* — Oppedahl Patent Law Firm LLC

(57) ABSTRACT

Embodiments presented herein include systems and methods for cooling a device, such as a computing system for an autonomous vehicle. In one or more embodiments, a linear drive actuator may be employed to circulate cooling fluid (or coolant) to the computing system. Unlike typical hydraulic or linear actuators, embodiments herein are capable of consistent directional circulation of the fluid while the actuator is moving in both forward and backward directions. Using a linear actuator not only uses fewer parts as compared to current cooling systems, but such embodiments have additional benefits. A linear actuator cooling system can use a smaller motor than traditional pump cooling systems, has more control relative to rate and pressure, produces less noise, produces fewer vibrations, and has a longer lifespan. Embodiments may also be configured to (Continued)

facilitate circulation of the coolant even in the event of a controller or motor actuator malfunction.

18 Claims, 16 Drawing Sheets

(56)                    References Cited

U.S. PATENT DOCUMENTS

| | | | | |
|---|---|---|---|---|
| 9,760,098 | B1 * | 9/2017 | Imwalle | H05K 7/20836 |
| 11,142,178 | B2 | 10/2021 | Ganzel et al. | |
| 12,515,527 | B2 * | 1/2026 | Yuan | B60L 3/0046 |
| 2008/0205003 | A1 * | 8/2008 | Belady | H05K 7/2079 |
| | | | | 361/700 |
| 2009/0126909 | A1 * | 5/2009 | Ellsworth, Jr. | H05K 7/20772 |
| | | | | 361/699 |
| 2011/0030364 | A1 * | 2/2011 | Persson | F15B 21/08 |
| | | | | 60/486 |
| 2011/0290328 | A1 * | 12/2011 | Jonsson | F24D 19/1039 |
| | | | | 137/334 |
| 2011/0290896 | A1 * | 12/2011 | Jonsson | F24D 3/12 |
| | | | | 237/81 |
| 2011/0303394 | A1 * | 12/2011 | Branton | H05K 7/20763 |
| | | | | 165/104.33 |
| 2012/0123595 | A1 * | 5/2012 | Bower, III | H05K 7/20772 |
| | | | | 700/282 |
| 2013/0240178 | A1 * | 9/2013 | Chandler | F28B 11/00 |
| | | | | 165/104.19 |
| 2015/0040848 | A1 * | 2/2015 | McAlister | F02D 19/06 |
| | | | | 123/445 |
| 2015/0233619 | A1 * | 8/2015 | Shedd | F25B 41/20 |
| | | | | 62/62 |
| 2016/0066472 | A1 * | 3/2016 | Cader | H05K 7/20263 |
| | | | | 361/699 |
| 2016/0085277 | A1 * | 3/2016 | Samadiani | H05K 7/20327 |
| | | | | 361/679.53 |
| 2019/0373776 | A1 * | 12/2019 | Gao | H05K 7/20772 |
| 2020/0163254 | A1 * | 5/2020 | Eadelson | F28D 15/0266 |
| 2020/0216052 | A1 | 7/2020 | Campau | |
| 2021/0155215 | A1 | 5/2021 | Ganzel | |
| 2021/0291618 | A1 * | 9/2021 | Xue | B60H 1/3202 |
| 2022/0095476 | A1 * | 3/2022 | Heydari | H05K 7/20772 |
| 2022/0110223 | A1 * | 4/2022 | Heydari | H05K 7/203 |
| 2022/0217872 | A1 * | 7/2022 | Heydari | H05K 7/20781 |
| 2022/0346271 | A1 * | 10/2022 | Chen | H05K 7/20763 |
| 2022/0354022 | A1 * | 11/2022 | Chen | H05K 7/20781 |
| 2023/0180444 | A1 * | 6/2023 | Heydari | H05K 7/20754 |
| 2023/0284423 | A1 * | 9/2023 | Heydari | H05K 7/20781 |
| 2023/0337402 | A1 * | 10/2023 | Davis | H05K 7/20772 |
| 2025/0374479 | A1 * | 12/2025 | Linde | G06F 1/206 |

FOREIGN PATENT DOCUMENTS

| | | | | |
|---|---|---|---|---|
| CA | 3227197 | A1 * | 2/2023 | H05K 7/20236 |
| CN | 102753798 | A * | 10/2012 | F01P 7/164 |
| CN | 108060968 | A * | 5/2018 | H05K 7/20927 |
| CN | 110525198 | A * | 12/2019 | B60L 58/26 |
| CN | 111526694 | B * | 12/2022 | H05K 7/20781 |
| CN | 115963908 | A * | 4/2023 | H05K 7/20781 |

OTHER PUBLICATIONS

Song et al., "Analysis, experiment and application of a power-saving actuator applied in the piston type energy recovery device", Oct. 2014, Desalination 361 (2015) 65-71. (Year: 2014).*

Feng et al., "Advanced Control Systems for Axial Piston Pumps Enhancing Variable Mechanisms and Robust Piston Positioning", Jun. 2023, Appl. Sci. 2023, 13, 9658. (Year: 2023).*

Shahi et al., "Design, Development, and Characterization of a Flow Control Device for Dynamic Cooling of Liquid-Cooled Servers", Journal of Electronic Packaging, Dec. 2022, vol. 144 / 041008-1. (Year: 2022).*

* cited by examiner

1100

1300

LIQUID COOLING SYSTEMS USING CYLINDER ACTUATOR FOR HIGH-PERFORMANCE COMPUTING SYSTEMS

TECHNICAL FIELD

Embodiments of the present disclosure relate generally to cooling systems. More particularly, embodiments of the disclosure relate to cooling devices (e.g., high-performance computing systems) that generate significant heat.

It shall be noted that the subject matter discussed in the background section should not be assumed to be prior art merely because of it being mentioned in this background section. Similarly, a problem mentioned in the background section or associated with the subject matter of the background section should not be assumed to have been previously recognized in the prior art. The subject matter in the background section merely represents different approaches, which in and of themselves may also be inventions.

BACKGROUND

Currently, some vehicles are equipped with the ability to operate in an autonomous mode (or nearly autonomous mode). Vehicles operating in an autonomous mode (e.g., driverless) can relieve the driver from at least some driving-related responsibilities. When operating in an autonomous mode, the vehicle can navigate to various locations using onboard sensors, allowing the vehicle to travel with minimal human interaction or in some cases without any passengers.

For a vehicle to operate in autonomous mode, it requires high-performance computing systems that operate complex machine learning (ML)/artificial intelligence (AI) models. Whether in training mode or inference mode (or a combination thereof), these models utilize extensive computational resources. A staggering number of compute operations require high-performance computing devices to perform their operations in a timely manner.

High-performance computing (HPC) systems are designed to perform complex and resource-intensive tasks at incredibly fast speeds. However, the high computational power they deliver comes at a cost of generating a significant amount of heat during operation. This heat that is generated is typically due to several factors.

A first factor is processor speed and density. HPC systems employ numerous high-speed processors, often densely packed within a small space. These processors execute calculations at rapid rates, and as a result, they generate heat as a byproduct of their energy consumption. For autonomous vehicles (AVs), between monitoring the road and road conditions, system components, and calculating all factors to safely operate the vehicle, almost incomprehensible numbers of calculations must be made in real time or near real time.

A second factor is electrical resistance. When electric currents pass through the components of computing systems, they encounter resistance, which leads to the generation of heat. This effect becomes more pronounced as processors and other components become smaller and more densely integrated.

A third factor is data transfer (read/write operations). Data movement within an HPC system also contributes to heat generation. Rapid data transfers between components, such as between the processor and memory, require energy and produce heat.

A fourth factor is intensive workloads. HPC systems often run computationally intensive machine learning models, vision-related processing, etc., which require sustained high processing power. This constant activity leads to continuous heat production.

A fifth factor is the environment in which the HPC operates. HPC systems for autonomous driving (AD) applications reside on a vehicle. They are not in data centers that have access to nearly unlimited power that can support auxiliary systems, such as dedicated cooling systems.

Thus, a significant issue to AD computing systems is dealing with the heat generated by the HPC that operate on the autonomous vehicles. Accordingly, what is needed are systems and methods that can provide good cooling for high performance computing systems, particularly those that operate critical systems, such as AD systems, and operating in challenging environments, such as on vehicles that have limited resources.

BRIEF DESCRIPTION OF THE DRAWINGS

References will be made to embodiments of the disclosure, examples of which may be illustrated in the accompanying figures. These figures are intended to be illustrative, not limiting. Although the disclosure is generally described in the context of these embodiments, it should be understood that it is not intended to limit the scope of the disclosure to these particular embodiments. Items in the figures may not be to scale.

Figure ("FIG.") 1 is a block diagram illustrating a networked system, according to embodiments of the present disclosure.

DETAILED DESCRIPTION

Figure 1:
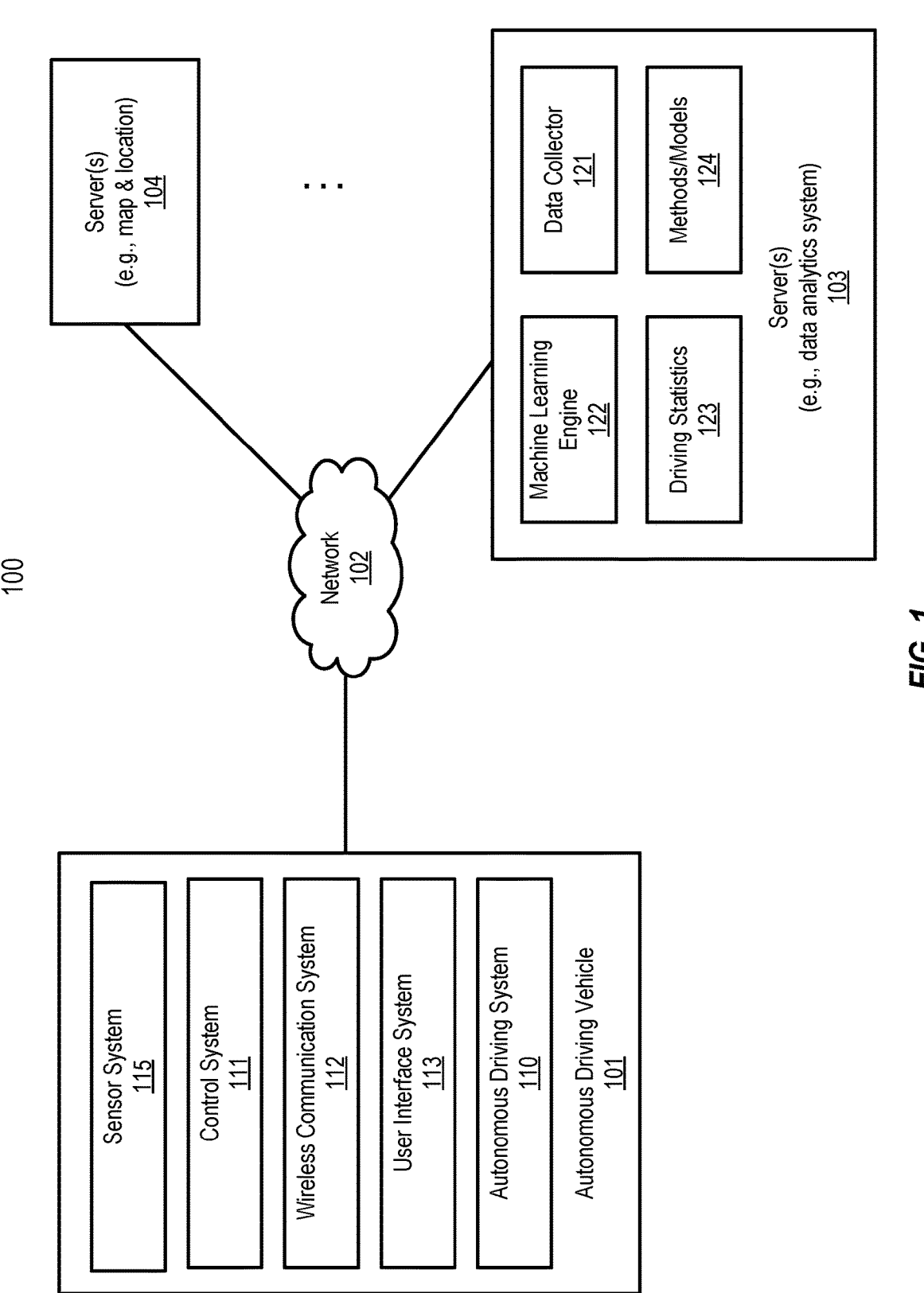

Various embodiments and aspects of the disclosures will be described with reference to details discussed below, and the accompanying drawings will illustrate the various embodiments. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosures. Furthermore, one skilled in the art will recognize that embodiments of the present disclosure, described below, may be implemented in a variety of ways, such as a process, an apparatus, a system, a device, or a method on a tangible computer-readable/ processor-readable medium.

Components, or modules, shown in diagrams are illustrative of exemplary embodiments of the disclosure and are meant to avoid obscuring the disclosure. It shall be understood that throughout this discussion that components may be described as separate functional units, which may comprise sub-units, but those skilled in the art will recognize that various components, or portions thereof, may be divided into separate components or may be integrated together, including, for example, being in a single system or component. It should be noted that functions or operations discussed herein may be implemented as components. Components may be implemented in software, hardware, or a combination thereof.

Furthermore, connections between components or systems within the figures are not intended to be limited to direct connections. Rather, data between these components may be modified, re-formatted, or otherwise changed by intermediary components. Also, additional or fewer connections may be used. It shall also be noted that the terms "coupled," "connected," "communicatively coupled," "interfacing," "interface," or any of their derivatives shall be understood to include direct connections, indirect connections through one or more intermediary devices, and wireless connections. It shall also be noted that any communication, such as a signal, response, reply, acknowledgment, message, query, etc., may comprise one or more exchanges of information.

Reference in the specification to "one or more embodiments," "preferred embodiment," "an embodiment," "embodiments," or the like means that a particular feature, structure, characteristic, or function described in connection with the embodiment is included in at least one embodiment of the disclosure and may be in more than one embodiment. Also, the appearances of the above-noted phrases in various places in the specification are not necessarily all referring to the same embodiment or embodiments.

The use of certain terms in various places in the specification is for illustration and should not be construed as limiting. A service, function, or resource is not limited to a single service, function, or resource; usage of these terms may refer to a grouping of related services, functions, or resources, which may be distributed or aggregated. The terms "include," "including," "comprise," "comprising," or any of their variants shall be understood to be open terms, and any lists of items that follow are example items and not meant to be limited to the listed items. A "layer" may comprise one or more operations. The words "optimal," "optimize," "optimization," and the like refer to an improvement of an outcome or a process and do not require that the specified outcome or process has achieved an "optimal" or peak state. The use of memory, database, information base, data store, tables, hardware, cache, and the like may be used herein to refer to system component or components into which information may be entered or otherwise recorded. A set may contain any number of elements, including the empty set.

One skilled in the art shall recognize that: (1) certain steps may optionally be performed; (2) steps may not be limited to the specific order set forth herein; (3) certain steps may be performed in different orders; and (4) certain steps may be done concurrently.

Any headings used herein are for organizational purposes only and shall not be used to limit the scope of the description or the claims. Each reference/document mentioned in this patent document is incorporated by reference herein in its entirety.

It shall be noted that any experiments and results provided herein are provided by way of illustration and were performed under specific conditions using a specific embodiment or embodiments; accordingly, neither these experiments nor their results shall be used to limit the scope of the disclosure of the current patent document.

It shall also be noted that although embodiments described herein may be within the context of autonomous driving (AD) computing systems, aspects of the present disclosure are not so limited. For example, the embodiments presented herein may be applied to systems that are not fully autonomous and may be applied in any application that requires cooling. Accordingly, aspects of the present disclosure may be applied or adapted for use in other contexts.

A. General Overview

An autonomous vehicle can navigate to various locations using onboard sensors, thereby allowing the vehicle to travel with little or no human interaction. A critical aspect of any vehicle, whether fully autonomous or not, is its computation operations. Most modern vehicles utilize some level of computation functions (e.g., antilock braking, efficient fuel control, transmission operation, safety monitoring (e.g., monitoring key components), etc.). For a vehicle to be safe, it must be able to properly rely upon these computation functions.

Computing systems, particularly autonomous driving (AD) computing systems, produce high levels of heat. However, heat can be detrimental to computing systems. Therefore, proper cooling is crucial for several reasons.

First, proper cooling directly affects performance and reliability. Excessive heat can cause components to overheat, which can degrade performance and, in the extreme, can result in malfunction. Cooling systems help maintain an optimal operating temperature range, ensuring that the system performs reliably and efficiently.

Second, proper cooling affects longevity. High temperatures can reduce the lifespan of electronic components. Effective cooling extends the life of the hardware, reducing the need for frequent (and often costly) replacements.

Third, proper cooling helps computing systems operate efficiently. Cooling systems help manage power consumption by maintaining a consistent temperature. Without proper cooling, computing systems tend to consume more power to compensate for increased heat.

Fourth, proper cooling helps maintain data and computation integrity. Extreme temperatures can corrupt or damage data and can affect computational processes-both of which can potentially lead to errors or data loss. Because these computing systems are dealing with critical items, preserving computational and data integrity is paramount.

Finally, independent of the safety involved in relying upon the proper operation of the computing systems, there are additional safety concerns posed by overheating that cause result in fire hazards and other safety risks. Adequate cooling mitigates these dangers. Furthermore, there are safety concerns if an autonomous driving system overheats, and its performance slows or is corrupted. A delayed computation, or a wrong computation, by an autonomous driving system can lead to serious injury or death.

Unfortunately, current methods to regulate the temperature of a vehicle's computer system are inadequate or introduce other issues. Consider a typical existing cooling system that comprises a liquid pump with a flow rate of ~20 gallons per minute and a power consumption of 96 watts electric motor, along with a pressure regulator. While such a system can be employed to circulate the cooling liquid within the case/housing of a computer system to dissipate the generated heat, it has drawbacks. For example, such an existing cooling system presents a significant NVH (noise, vibration, and harshness) problem, with levels exceeding 60 dB. Additionally, it incurs high costs due to its reliance on a large motor and frequent use of liquid pressure to regulate the system's pressure. In addition, the liquid pump's gear may cause an increase in the temperature of the cooling liquid it pumps. Accordingly, what is needed are better cooling systems that offer superior performance, low NVH (noise, vibration, and harshness) levels, and high efficiency.

Embodiments herein employ a cost-effective linear drive actuator to circulate cooling liquid through a computing system housing (or case) to cool the computing system. In one or more embodiments, the cooling system is capable of fluid movement in both forward and backward directions. By utilizing such embodiments, noise and vibration levels can be reduced (e.g., to less than 33 dB). Additionally, in one or more embodiments, in the event of a motor actuator malfunction, the system automatically opens the valves to maintain basic functionality through thermal density flow created by the relative height positions of the cooled coolant to the heated coolant. Another advantage of embodiments is that it provides reduced overall fluid pressure and has greater control of the fluid pressure. Finally, in addition to using a smaller motor, embodiments utilize fewer parts compared to the current designs, which means better costs and fewer components to wear and require repair. One skilled in the art shall recognize additional advantages that are not enumerated here for sake of brevity.

B. Embodiments of an Autonomous Driving Vehicle

FIG. 1 is a block diagram illustrating an autonomous driving network configuration according to one or more embodiments of the present disclosure. Referring to FIG. 1, network configuration 100 includes autonomous driving vehicle (ADV) 101 that may be communicatively coupled to one or more servers 103-104 over a network 102. Although one ADV is shown, multiple ADVs may be coupled to each other and/or coupled to servers 103-104 over network 102. Network 102 may be any type of network, such as a local area network (LAN), a wide area network (WAN) such as the Internet, a cellular network, a satellite network, an edge network, or a combination thereof, and may comprise wired, wireless, or both connectivity. Server(s) 103-104 may be any kind of server or a cluster of servers, such as Web or cloud servers, application servers, backend servers, or a combination thereof. Servers 103-104 may be data analytics servers, content servers, traffic information servers, map and point of interest (MPOI) servers, location servers, etc.

An ADV refers to a vehicle that may be configured to operate in an autonomous mode in which the vehicle navigates through an environment with little or no input from a driver. Such an ADV may include a sensor system having one or more sensors that are configured to detect information about the environment in which the vehicle operates. The vehicle and its associated controller(s) may use the detected information to navigate through the environment. ADV 101 may operate in a manual mode, a fully autonomous mode, or a partially autonomous mode.

In one or more embodiments, ADV 101 includes, but is not limited to, an autonomous driving system (ADS) 110, vehicle control system 111, wireless communication system 112, user interface system 113, and sensor system 115. ADV 101 may further include certain common components included in ordinary vehicles, such as an engine, wheels, steering wheel, transmission, etc., which may be controlled by vehicle control system 111 and/or ADS 110 using a variety of communication signals and/or commands, such as, for example, acceleration signals or commands, deceleration signals or commands, steering signals or commands, braking signals or commands, etc.

Components 110-115 may be communicatively coupled to each other via an interconnect, a bus, a network, wireless signals, or a combination thereof. For example, components 110-115 may be communicatively coupled to each other via a controller area network (CAN) bus. In one or more embodiments, a CAN bus is a vehicle bus standard designed to allow microcontrollers and devices to communicate with each other in applications without a host computer; it is a message-based protocol, designed originally for multiplex electrical wiring within automobiles but may also be used in many other contexts.

Figure 2:
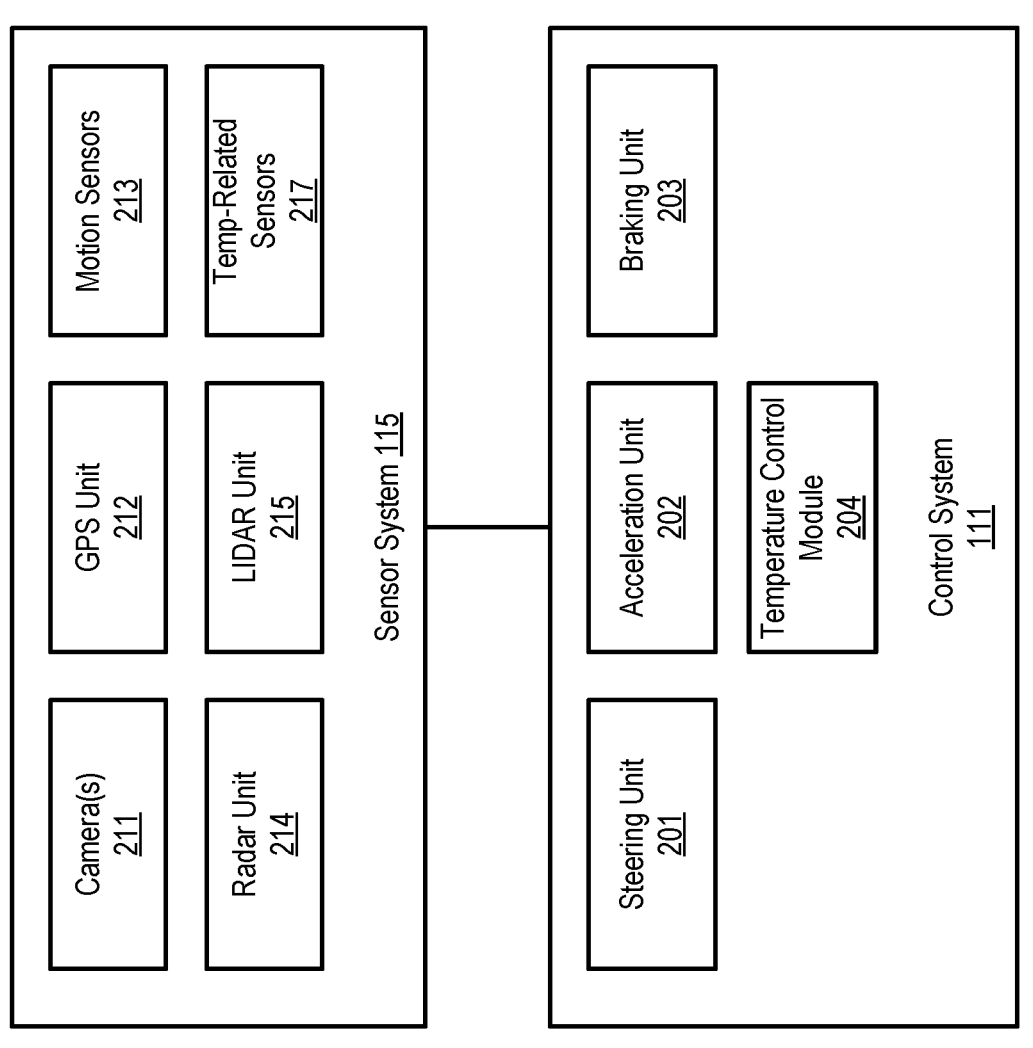
FIG. 2 is a block diagram illustrating an example of an autonomous driving vehicle, according to embodiments of the present disclosure.

Referring now to FIG. 2, in one or more embodiments, the sensor system 115 includes, but is not limited to, one or more cameras 211, a global positioning system (GPS) unit or module 212, one or more motion sensors (e.g., inertial measurement unit (IMU), accelerometer, etc.) 213, radar unit 214, and a light detection and range (LIDAR) unit 215. GPS system 212 may include a transceiver operable to provide information regarding the position of the ADV. The motion sensor unit 213 may sense position and orientation changes of the ADV based on inertial acceleration. Radar unit 214 may represent a system that utilizes radio signals to sense objects within the local environment of the ADV. In one or more embodiments, in addition to sensing objects, radar unit 214 may additionally sense the speed and/or heading of the objects. LIDAR unit 215 may sense objects in the environment in which the ADV is located using lasers. LIDAR unit 215 could include one or more laser sources, a laser scanner, and one or more detectors, among other system components. Cameras 211 may include one or more devices to capture images of the environment surrounding the ADV. Cameras 211 may be still cameras and/or video cameras. A camera may be mechanically movable, for example, by mounting the camera on a rotating and/or tilting a platform.

Sensor system 115 may further include other sensors, such as a sonar sensor, an infrared sensor, a steering sensor, a throttle sensor, a braking sensor, an audio sensor (e.g., a microphone), and a weight or mass sensor. An audio sensor may be configured to capture sound from the environment surrounding the ADV. A steering sensor may be configured to sense the steering angle of a steering wheel, wheels of the vehicle, or a combination thereof. A throttle sensor and a braking sensor sense the throttle position and braking position of the vehicle, respectively. In some situations, a throttle sensor and a braking sensor may be integrated as an integrated throttle/braking sensor. In one or more embodiments, one or more sensors may be used to determine the mass or weight of the ADV, including its occupants and any other payload. In one or more embodiments, the mass/weight may be determined using one or more factors, such as torque (e.g., wheel torque need to accelerate, braking torque needed to accelerate or decelerate, etc.). Having one or more mass/ weight sensors to gauge the overall weight of the ADV and its contents (including occupants) allows the ADV to use mass and/or weight parameters for one or more determinations, such as braking, accelerating, handling, etc.

In one or more embodiments, vehicle control system 111 includes, but is not limited to, steering unit 201, throttle unit 202 (also referred to as an acceleration unit), and braking unit 203 (also referred to as the braking system 203). Steering unit 201 may be used to adjust the direction or heading of the vehicle. Throttle unit 202 may be used to control the speed of the motor or engine which in turn controls the speed and acceleration of the vehicle. Braking unit 203 may be used to decelerate the vehicle by providing friction to slow the wheels or tires of the vehicle. The steering unit 201, the acceleration unit 202, and the braking system 203 may be coupled, in part, with the AD control or AD system (e.g., ADS 110 in FIG. 3A).

Sensor system 115 may further include one or more sensors 217 related to temperature or cooling systems. For example, the temperature-related sensor(s) 217 may include one or more temperature sensors (e.g., thermocouples, thermometers, etc.). It shall be noted that one or more other temperature-related sensors may be present, such as pressure sensors. In one or more embodiments, data from one or more temperature-related sensors may be supplied to temperature control module 204, which may comprise one or more control systems or interfaces for affecting cooling or heating systems for the ADV. For example, the temperature control module 204 may monitor the temperature of a computing system on which the ADV systems (e.g., ADV 101) operates. As noted previously, maintaining the computing system within a certain operating temperature range can be important for the computing system to properly and timely operate. Also, since the vehicle may be fully autonomous, it is imperative that its computing abilities not be inhibited, take too long to process, or make erroneous calculations. Furthermore, keeping the computing system within a certain operational temperature range helps prolong the life of the computing components. Details about embodiments related to temperature maintenance are discussed in more detail below.

Note that the one or more of the components shown in FIG. 2 may be implemented in hardware, software, or a combination thereof.

Returning to FIG. 1, wireless communication system 112 is to allow communication between ADV 101 and external systems, such as devices, sensors, other vehicles, etc. For example, wireless communication system 112 may wirelessly communicate with one or more devices directly or via a communication network, such as servers 103-104 over network 102. Wireless communication system 112 may use any cellular communication network or a wireless local area network (WLAN), e.g., using WiFi to communicate with another component or system. Wireless communication system 112 may communicate directly with a device (e.g., a mobile device of a passenger, a display device, a speaker within vehicle 101), for example, using an infrared link, Bluetooth, etc. User interface system 113 may be part of peripheral devices implemented within vehicle 101 including, for example, a keyboard, a touch screen display device, a microphone, and a speaker, etc.

Some or all of the functions of ADV 101 may be controlled or managed by ADS 110, especially when operating in an autonomous driving mode, but may also provide functionality when operating in manual mode. ADS 110 includes hardware (e.g., processor(s), memory, storage, etc.) and software (e.g., operating system, planning and routing programs, etc.) to receive information from sensor system 115, control system 111, wireless communication system 112, and/or user interface system 113, process the received information, plan a route or path from a starting point to a destination point, and then drive vehicle 101 based on the planning and control information. Alternatively, ADS 110 may be integrated with vehicle control system 111.

A user as a passenger may specify a starting location and a destination of a trip, for example, via a user interface. ADS 110 obtains the trip-related data. For example, ADS 110 may obtain location and route data from an MPOI server, which may be a part of servers 103-104. The location server provides location services and the MPOI server provides map services and the POIS (points of interests) of certain locations. Additionally, or alternatively, such location and MPOI information may be cached locally in a persistent storage device of ADS 110.

While ADV 101 is moving along the route, ADS 110 may also obtain real-time traffic information from a traffic information system or server (TIS). Note that servers 103-104 may be operated by a third-party entity. Additionally, or alternatively, the functionalities of servers 103-104 may be integrated with ADS 110. Based on the real-time traffic information, MPOI information, and location information, as well as real-time local environment data detected or sensed by the sensor system 115 (e.g., obstacles, objects, nearby vehicles), ADS 110 can plan an optimal route and drive vehicle 101, for example, via control system 111, according to the planned route to reach the specified destination safely and efficiently.

Server 103 may be a data analytics system to perform data analytics services for a variety of clients. In one or more embodiments, a data analytics system 103 includes a data collector 121 and a machine learning engine 122. Data collector 121 collects driving statistics 123 from a variety of vehicles, either ADVs or regular vehicles driven by human drivers. Driving statistics 123 include information indicating the driving commands (e.g., throttle, brake, steering commands) issued and responses of the vehicles (e.g., speeds, accelerations, decelerations, directions) captured by sensors of the vehicles at different points in time. Driving statistics 123 may further include information describing the driving environments at different points in time, such as, for example, routes (including starting and destination locations), MPOIs, road conditions, weather conditions, etc.

In one or more embodiments, based on driving statistics 123, machine learning engine 122 generates or trains a set of rules, algorithms (methods), and/or predictive models 124 for a variety of purposes. For example, in one or more embodiments, methods/models 124 may include one or more algorithms or models to receive data from a plurality of sensors mounted on the ADV related to the ADV being held at or brought to a standstill, one or more methods for detecting a status of the ADV including a rolling speed of the ADV based on the data from the plurality of sensors, one or more methods to activate or deactivate one or more of the braking units (e.g., a primary brake and/or a secondary brake) in response to detecting the status of the ADV being at a particular status, which may be based upon one or more predetermined speed threshold ranges. Methods/models 124 may be uploaded on ADVs to be utilized during autonomous driving in real time.

Figure 3A:
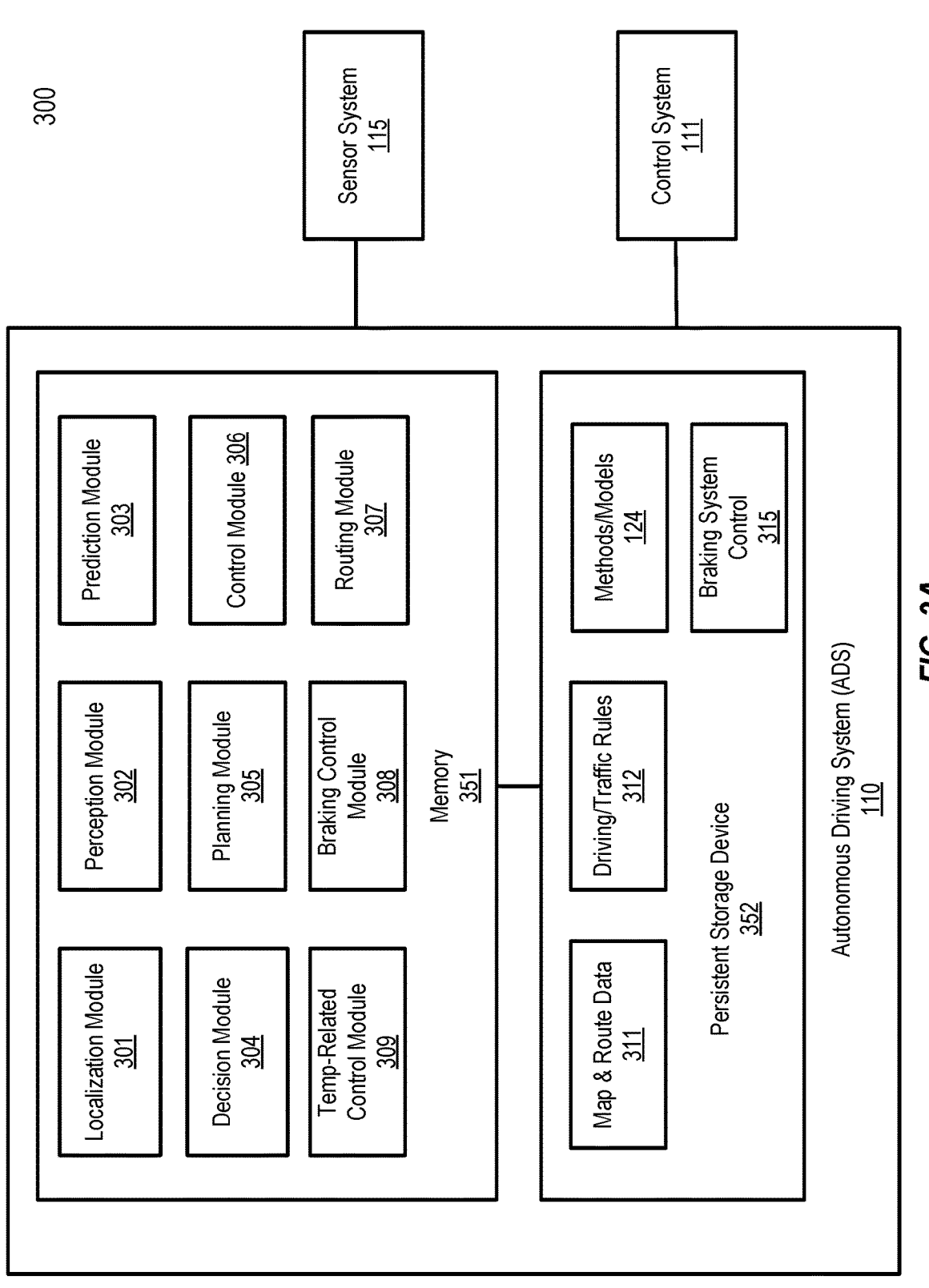
FIGS. 3A & 3B are block diagrams illustrating an example of an autonomous driving system used with an autonomous driving vehicle, according to embodiments of the present disclosure.
Figure 3B:
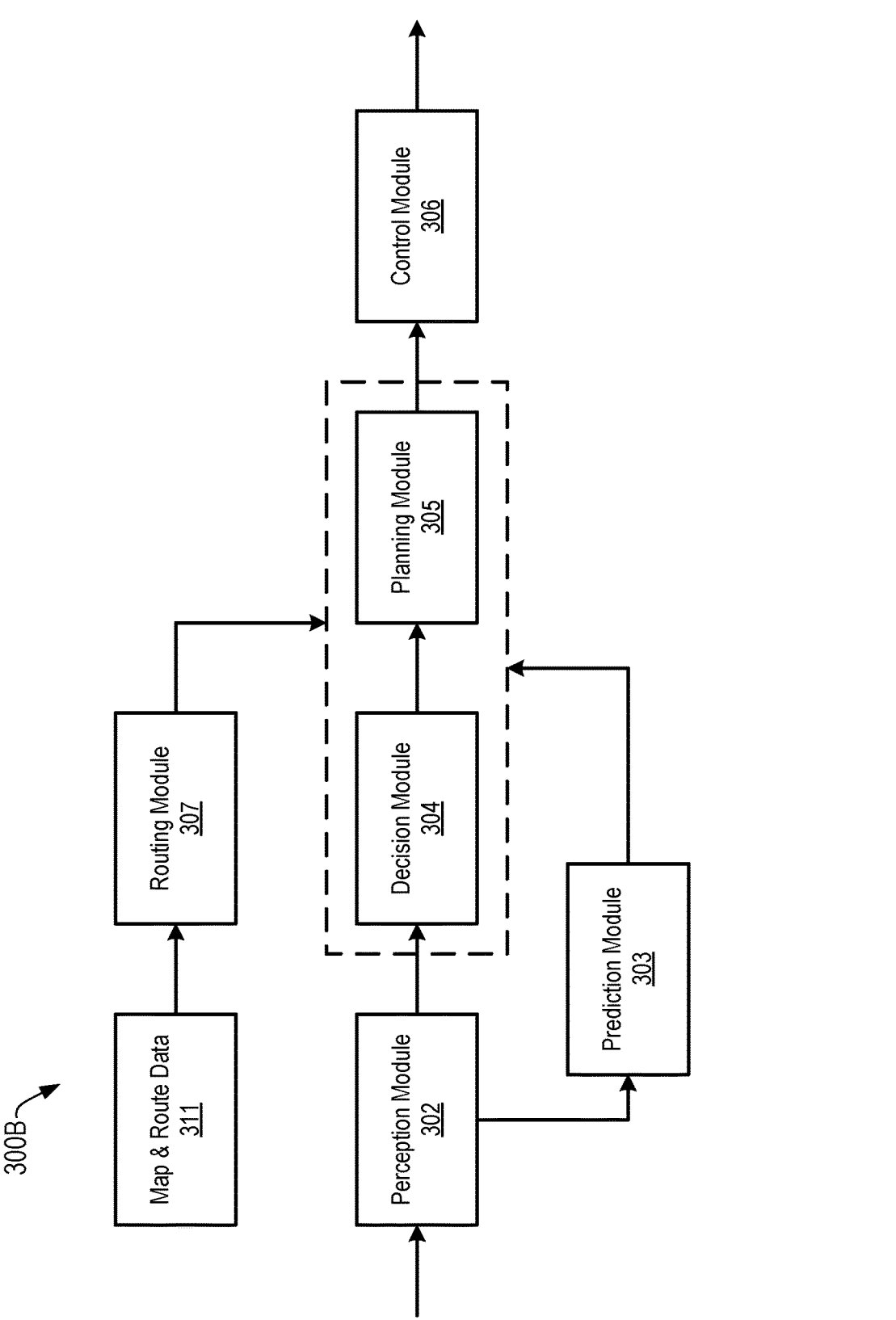

FIGS. 3A and 3B are block diagrams illustrating an example of an autonomous driving system used with an ADV, according to embodiments of the present disclosure. System 300 may be implemented as a part of ADV 101 of FIG. 1 including, but is not limited to, ADS 110, control system 111, and sensor system 115. Referring to FIGS. 3A and 3B, ADS 110 includes, but is not limited to, localization module 301, perception module 302, prediction module 303, the decision module 304, planning module 305, control module 306, routing module 307, braking system control module 308, and temperature-related control module 309. Referring to FIG. 3B, planning module 305, control module 306, and/or other modules may perform the computations, determinations, and steps required to instruct the operation of systems of the vehicle.

Some or all of modules 301-309 may be implemented in software, hardware, or a combination thereof. For example, these modules may be installed in persistent storage device 352, loaded into memory 351, and executed by one or more processors (not shown). Note that some or all of these modules may be communicatively coupled to or integrated with some or all modules of vehicle control system 111 of FIG. 2. Some of modules 301-309 may be integrated together as an integrated module.

Localization module 301 may determine a current location of ADV 300 (e.g., leveraging GPS unit 212) and manages any data related to a trip or route of a user. Localization module 301 (also referred to as a map and route module) manages any data related to a trip or route of a user. A user may log in and specify a starting location and a destination of a trip, for example, via a user interface. Localization module 301 communicates with other components of ADV 300, such as a map and route data 311, to obtain the trip-related data. For example, localization module 301 may obtain location and route data from a location server and a map and POI (MPOI) server. A location server provides location services and an MPOI server provides map services and the POIs of certain locations, which may be cached as part of map and route data 311. While ADV 300 is moving along the route, localization module 301 may also obtain real-time traffic information from a traffic information system or server.

Based on the sensor data provided by sensor system 115 and localization information obtained by localization module 301, a perception of the surrounding environment is determined by perception module 302. The perception information may represent what an ordinary driver would perceive surrounding a vehicle in which the driver is driving. The perception may include the lane configuration, traffic light signals, a relative position of another vehicle, a pedestrian, a building, a crosswalk, or other traffic-related signs (e.g., stop signs, yield signs), etc., for example, in a form of an object. The lane configuration includes information describing a lane or lanes, such as, for example, a shape of the lane (e.g., straight or curvature), a width of the lane, how many lanes in a road, one-way or two-way lane, merging or splitting lanes, exiting lane, etc.

Perception module 302 may include a computer vision system or functionalities of a computer vision system to process and analyze images captured by one or more cameras to identify objects and/or features in the environment of the ADV. The objects may include traffic signals, roadway boundaries, other vehicles, pedestrians, and/or obstacles, etc. The computer vision system may use object recognition methods, video tracking, and other computer vision techniques. In one or more embodiments, the computer vision system maps an environment, tracks objects, and estimates the speed of objects, etc. Perception module 302 may also detect objects based on other sensor data provided by other sensors such as a radar and/or LIDAR.

For each of the objects, prediction module 303 predicts how the object will behave under the circumstances. The prediction may be performed based on the perception data perceiving the driving environment at the point in time given a set of map/route information 311, traffic rules 312, and/or braking system control parameters 315. For example, if the object is a vehicle in an opposing direction and the current driving environment includes an intersection, prediction module 303 may predict whether the vehicle is likely to move straight forward or make a turn. If the perception data indicates that the intersection has no traffic light, prediction module 303 may predict that the vehicle may have to fully stop before entering the intersection. If the perception data indicates that the vehicle is currently at a left-turn-only lane or a right-turn-only lane, prediction module 303 may predict that the vehicle is more likely to make a left turn or right turn, respectively.

The prediction module 303 may calculate a rate of deceleration or stop distance based on the braking system control parameters 315 to determine a safe zone for driving at a desired speed. For example, some obstacles/vehicles, road conditions, and/or safety conditions (e.g., open door) may cause the prediction module 303 to steer or decelerate to maintain safety. The braking control parameters 315 may include recorded deceleration data indicating an upper limit and/or environment-correlated deceleration rates. In one or more embodiments, the braking system control parameters 315 may be used by one or more braking systems (e.g., PBS, SBS, electric parking brake (EPB), etc.).

For each of the objects, decision module 304 may make a decision regarding how to handle the object. For example, for a particular object (e.g., another vehicle in a crossing route) as well as its metadata describing the object (e.g., a speed, direction, turning angle, etc.), decision module 304 may decide how to encounter the object (e.g., overtake, yield, stop, pass, etc.). Decision module 304 may make such decisions according to a set of rules, such as traffic rules or driving rules 312, which may be stored in persistent storage device 352.

In one or more embodiments, routing module 307 is configured to provide one or more routes or paths from a starting point to a destination point. For a given trip from a start location to a destination location, for example, received from a user, routing module 307 obtains route and map information 311 and determines all possible routes or paths from the starting location to reach the destination location. Routing module 307 may generate a reference line in the form of a topographic map for each of the routes it determines from the starting location to reach the destination location. A reference line refers to an ideal route or path without any interference from others such as other vehicles, obstacles, or traffic conditions. That is, if there is no other vehicle, pedestrians, or obstacles on the road, an ADV should exactly or closely follow the reference line. The topographic maps are then provided to decision module 304 and/or planning module 305. Decision module 304 and/or planning module 305 examine all of the possible routes to select and modify one of the most optimal routes in view of other data provided by other modules such as traffic conditions from localization module 301, driving environment perceived by perception module 302, and traffic condition predicted by prediction module 303. The actual path or route for controlling the ADV may be close to or different from the reference line provided by routing module 307 depending upon the specific driving environment at the point in time.

Based on a decision for each of the objects perceived, planning module 305 plans a path or route for the ADV, as well as driving parameters (e.g., distance, speed, and/or turning angle), using a reference line provided by routing module 307 as a basis. That is, for a given object, the decision module 304 decides what to do with the object, while planning module 305 determines how to do it. For example, for a given object, decision module 304 may decide to pass the object, while planning module 305 may determine whether to pass on the left side or right side of the object. Planning and control data is generated by planning module 305 including information describing how vehicle 300 would move in a next moving cycle (e.g., next route/path segment). For example, the planning and control data may instruct vehicle 300 to move 10 meters at a speed of 30 miles per hour (mph), then change to a right lane at the speed of 25 mph.

Based on the planning and control data, control module 306 controls and drives the ADV, by sending proper commands or signals to vehicle control system 111, according to a route or path defined by the planning and control data. In one or more embodiments, the planning and control data include sufficient information to drive the vehicle from a first point to a second point of a route or path using appropriate vehicle settings or driving parameters (e.g., throttle, braking, steering commands, etc.) at different points in time along the path or route.

In one or more embodiments, the planning phase is performed in a number of planning cycles, also referred to as driving cycles, such as, for example, in every time interval of 100 milliseconds (ms). For each of the planning cycles or driving cycles, one or more control commands may be issued based on the planning and control data. That is, for every 100 ms, planning module 305 plans a next route segment or path segment, for example, including a target position and the time required for the ADV to reach the target position. Alternatively, planning module 305 may further specify the specific speed, direction, and/or steering angle, etc. In one or more embodiments, planning module 305 plans a route segment or path segment for the next predetermined period of time such as 5 seconds. For each planning cycle, planning module 305 plans a target position for the current cycle (e.g., the next 5 seconds) based on a target position planned in a previous cycle. Control module 306 may then generate one or more control commands (e.g., throttle, brake, steering control commands, etc.) based on the planning and control data of the current cycle.

Note that decision module 304 and planning module 305 may be integrated as an integrated module. Decision module 304/planning module 305 may include a navigation system or functionalities of a navigation system to determine a driving path for the ADV. For example, the navigation system may determine a series of speeds and directional headings to affect the movement of the ADV along a path that substantially avoids perceived obstacles while generally advancing the ADV along a roadway-based path leading to an ultimate destination. The destination may be set according to user inputs via user interface system 113. The navigation system may update the driving path dynamically while the ADV is in operation. The navigation system may incorporate data from a GPS system and one or more maps to determine the driving path for the ADV.

Also depicted in FIG. 3A is a temperature control module 309 that may receive one or more measurements related to temperature for controlling systems that operate within certain temperature ranges. In one or more embodiments, the temperature-related control module 309 may receive temperature readings of the computing system of the ADV. To keep the computing system within an operational temperature range, the temperature-related control module 309 may control a cooling system, embodiments of which are disclosed in more detail below.

Figure 4:
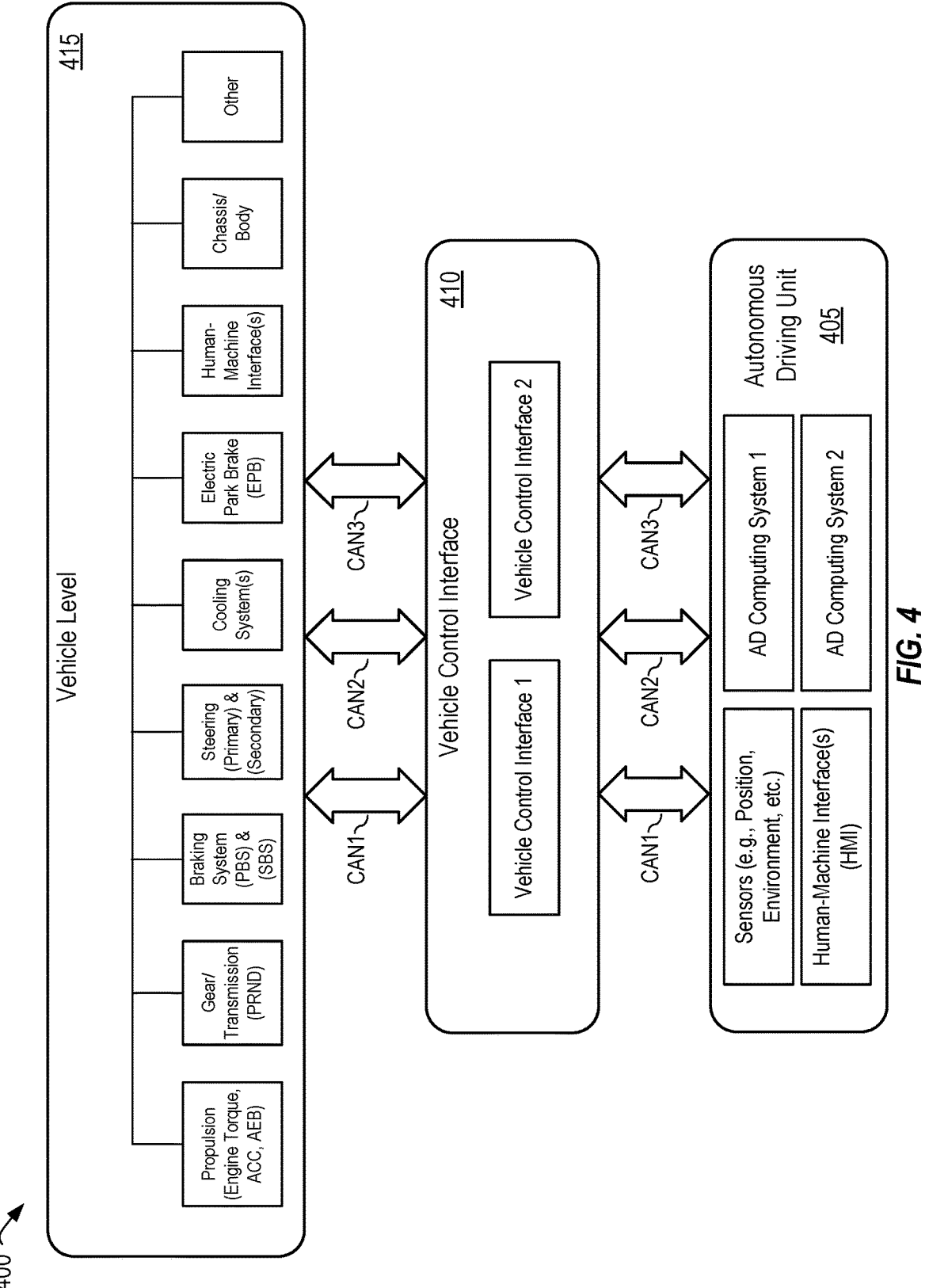
FIG. 4 is a block diagram of an example control system, in accordance with aspects of the present disclosure.

FIG. 4 is a block diagram 400 of an example control system, in accordance with aspects of the present disclosure. As shown, the example control system may include three high-level components: the autonomous driving unit 405, the vehicle control interface 410, and the vehicle level components 415.

The autonomous driving unit 405 may include various sensors (e.g., cameras, microphones, LIDAR, GPS, accelerometers, door sensors, light sensors, proximity sensors, thermal sensors, tilt sensors, hydraulic pressure sensors, brake caliper sensors, etc.). The autonomous driving unit may include one or more autonomous driving computer systems for computing control inputs to the vehicle-level components (e.g., engine, braking system, steering, etc.).

The vehicle control interface 410 allows the sensor information to be provided to the various vehicle-level components 415. For example, a command/output from the AD computer system may be used to actuate two or more components (e.g., steering, brake, cooling, etc.) at the vehicle level. According to aspects of the present disclosure, handling cooling may be implemented using sensors, the cooling system at the vehicle level, and one or more computing systems.

In one or more embodiments, the vehicle-level elements may include propulsion-related components (or elements), gear/transmission-related components, steering, braking, interfacing, chassis/body, cooling system(s), and other elements (e.g., tire pressure sensors and controls). While these vehicle-level components are depicted as being connected or communicatively connected via a single connection, there may be one or more redundant connections; there may also be differently configured connections (i.e., certain components may be on different connection segments than other components). The vehicle-level components may include various sensors for providing feedback to the respective operations.

In one or more embodiments, the vehicle-level system may include cooling systems for maintaining one or more components (e.g., engine, computing system, etc.) within an operational temperature range for the respective component. Different cooling systems may be used for different components. For example, if the vehicle includes an engine that requires cooling, the cooling system for the engine may be separate from a cooling system for the computing system. In one or more embodiments, one or more elements of the cooling system may be used in common between cooling systems.

Figure 5:
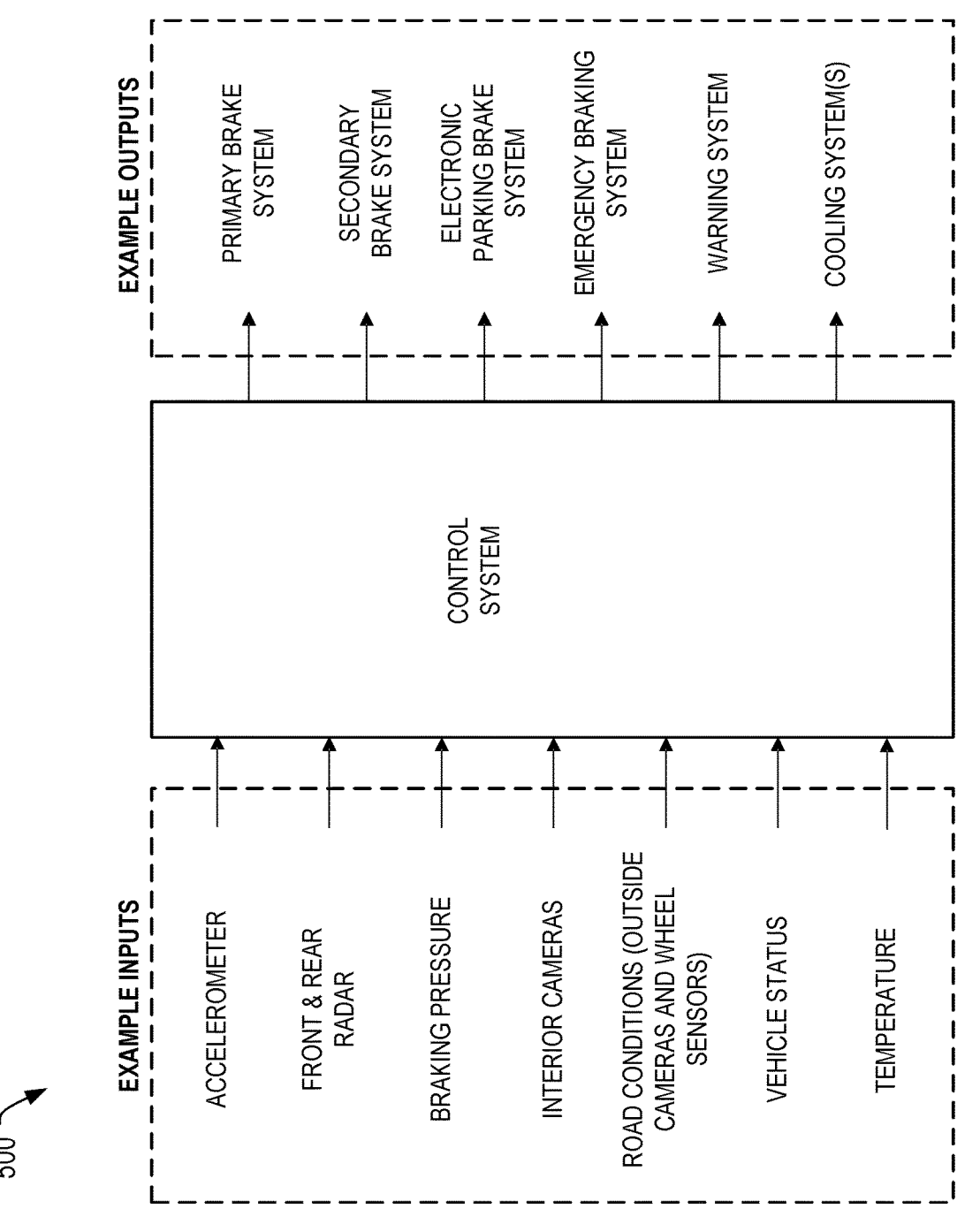
FIG. 5 depicts a diagram of an example control system and associated inputs and outputs, according to embodiments of the present disclosure.

FIG. 5 depicts a diagram 500 of an example control system and associated inputs and outputs, according to embodiments of the present disclosure. As shown, the control system may use various measurements or sensor feedback as input. The example inputs may include information (e.g., speed) from one or more accelerometers, braking pressure valves, hydraulic pressure, brake caliber valves, radar (or LIDAR) information of the front and rear of the ADV, imaging information from interior cameras, road conditions captured by exterior cameras and/or wheel sensors, door sensors, vehicle status (e.g., speed, operation conditions of various systems, such as whether one or more of the braking systems are operating properly, etc.), temperature, and pressure of coolant system. While not depicted, in one or more embodiments, the control system may receive one or more failure messages related to thermal conditions of a critical component, such as the computing system.

Upon determining a status based upon one or more sensor inputs or messages, the control system may provide various outputs to various systems of the ADV. For example, outputs may include control signals to control cooling of the computing system, pressure of the coolant of the cooling system, and warning systems, among others, for handling thermal control of the computing system for the ADV, as disclosed in the current patent document.

In one or more embodiments, one or more wheel sensors may be used to detect speed of the ADV. The wheel sensors may generate magnetic pulses in the form of waves, proportional to the speed of the ADV. For example, one or more of the ADV's wheel sensors, which may be located at each of the wheels (i.e., front left (FL), front right (FR), rear left (RL), rear right (RR) wheel), may be used to detect the speed of the ADV based on pulses detected. In one or more embodiments, when at least two diagonal wheel sensors (e.g., FL & RR or FR & RL) detect pulses within a set time period, the control system may register a status or state of the ADV. The ADV may be in different states based on the speed of the ADV, and different control techniques may be applied accordingly.

Different actions may be activated or triggered based on different states of the ADV. It shall also be noted that one or more different conditions may be monitored and/or may be combined to form a detected state.

In one or more embodiments, the control system may receive temperature information related to one or more systems (e.g., computing system(s)) and may take action to control one or more cooling systems to keep the computing system from overheating.

Note that some or all components as shown and described above may be implemented in software, hardware, or a combination thereof. For example, such components can be implemented as software installed and stored in a persistent storage device, which can be loaded and executed in memory by a processor (not shown) to carry out the processes or operations described throughout this application. Alternatively, such components can be implemented as executable code programmed or embedded into dedicated hardware such as an integrated circuit (e.g., an application-specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the detailed descriptions presented herein are presented in terms of methods and symbolic representations of operations on data bits within a computer memory. These descriptions and representations are the ways used by those skilled in the data processing arts to most effectively convey the substance of their work to others skilled in the art. A method may, generally, be conceived to be a self-consistent sequence of operations leading to a desired result or results; the operations may be considered to be those requiring physical manipulations of physical quantities.

It should be borne in mind, however, that these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

C. Cooling System Embodiments

Figure 6:
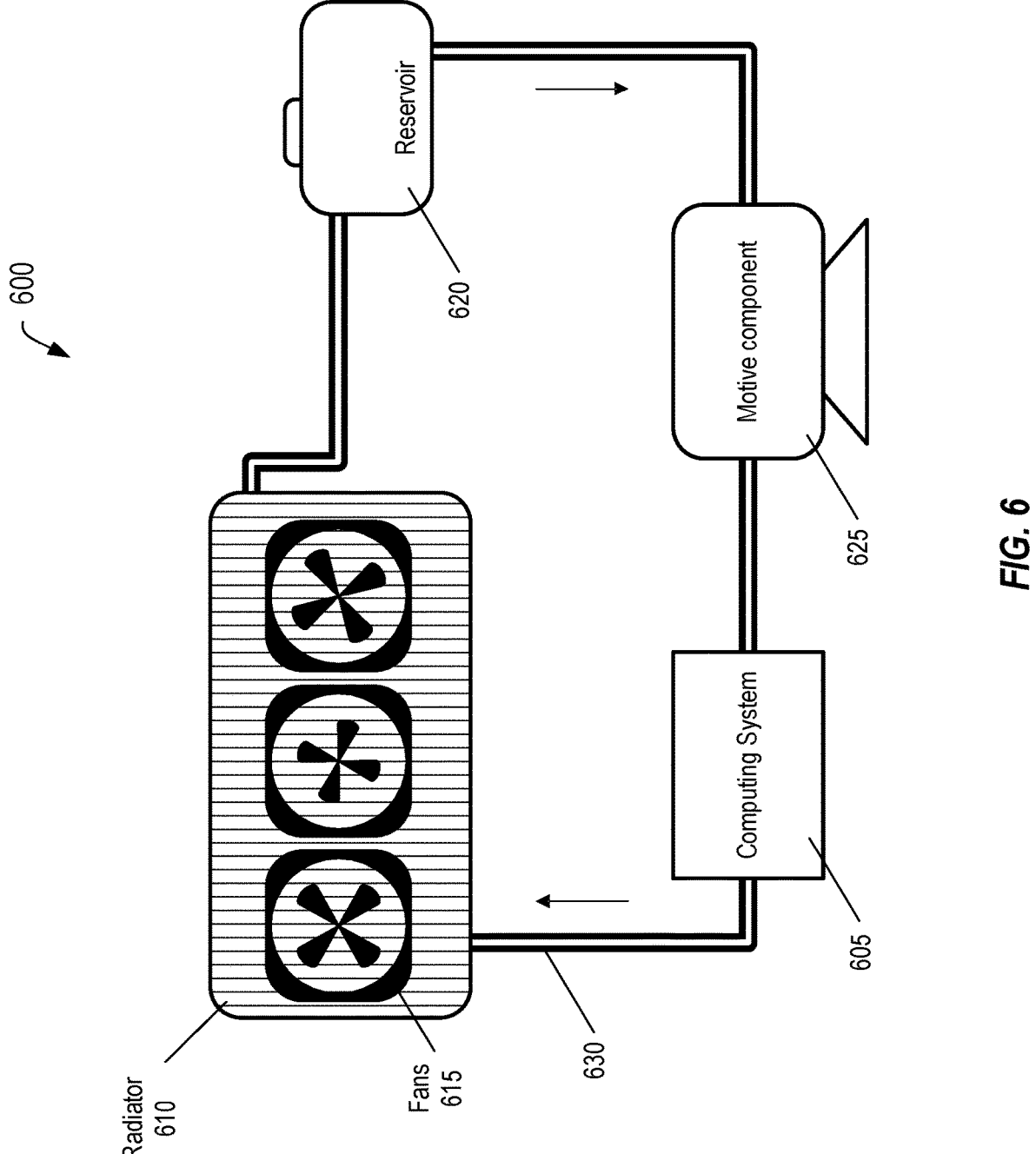
FIG. 6 depicts a cooling system for cooling a computing system, according to embodiments of the present disclosure.

Turning now to FIG. 6, depicted is a cooling system 600 for cooling a computing system 605, according to embodiments of the present disclosure. As depicted, the embodiment comprises a computing system 605, which may be in a housing that facilitates liquid cooling to promote thermal exchange from the heated components of the computing system 605 to the coolant without exposing the components to the coolant so that it cannot damage the components.

Liquid cooling offers several benefits when compared to air cooling methods. Liquid cooling is significantly more efficient at dissipating heat than air cooling. It can maintain lower operating temperatures for components like central processing units (CPUs), graphics processing units (GPUs), and tensor processing units (TPUs), resulting in improved performance and reduced thermal throttling. Liquid cooling systems also tend to be quieter than air-cooled systems since they do not rely on large, noisy fans. Another benefit of liquid cooling systems is that they can be more compact than large air-cooling solutions, making them ideal for small form factor systems. Yet another benefit of liquid cooling systems is that they provide consistent and uniform cooling across components-ensuring that no part of the system is subjected to hotspots, which can be a problem in some air-cooled setups. By maintaining lower operating temperatures, liquid cooling can potentially extend the lifespan of electronic components by reducing thermal stress on them.

One problem with air cooling is dust accumulation. Air cooling systems tend to attract and trap dust, which can hinder thermal performance, but liquid cooling eliminates the need for large fans and reduces dust buildup.

Another helpful feature of liquid cooling is its more flexible setup relative to air cooling. Liquid cooling can be customized to fit the specific needs of a system. Different types of coolants and various configurations may be used to optimize cooling for components. For example, the radiator may be positioned in a number of places in the vehicle for cooling. In one or more embodiments, the radiator may be mounted inside the bumper of the vehicle with cutouts in the bumper to allow for airflow. Additionally, or alternatively, one or more fans may be used to help cool the liquid as if traverses the radiator.

It should also be noted that some liquid cooling solutions are designed to be more environmentally friendly, with coolants that have lower global warming potential and reduced environmental impact compared to traditional refrigerants.

In one or more embodiments, the liquid coolant may be single-phase or two-phase coolants, which refers to the state of the coolant within a cooling system and the method by which it dissipates heat from electronic components or other heat sources. These two cooling approaches have distinct characteristics.

Single-phase coolants are in a liquid state throughout the cooling process. They do not undergo phase changes, such as evaporation, during the heat dissipation process. For operation, single-phase coolants transfer heat primarily through conduction and natural convection within the liquid. Heat is absorbed by the coolant and carried away as thermal energy within the liquid. Single-phase coolants are commonly used in closed-loop liquid cooling systems for electronics, including high-performance computing systems. They are well suited for situations where consistent and predictable cooling is needed.

Two-phase coolants undergo a phase change from liquid to vapor (evaporation) during the heat dissipation process. This change in phase is an integral part of the cooling mechanism. In two-phase cooling, heat is absorbed by the coolant, causing it to evaporate into vapor. This vapor rises, carrying the heat with it. It then condenses back into a liquid, releasing the heat, and the process repeats. This phase change enhances the cooling efficiency. Two-phase coolants are often used in specialized cooling applications where high heat fluxes need to be managed efficiently, such as in some advanced electronics and high-power applications. They are particularly useful when traditional single-phase cooling methods may not be sufficient to handle extreme thermal loads.

Single-phase coolants are suitable for general-purpose electronic cooling, such as in ADV. Concerning single-phase coolants for cooling computing systems or electronics, there are several types. Some common types of coolants for cooling computing systems include, but are not limited to, deionized water (DI water). Deionized water is one of the most common coolants used in liquid cooling systems. It is non-conductive and has good heat transfer properties. However, it should be used with caution as it can become conductive if it picks up impurities from the environment. Distilled water is another popular choice for cooling systems. Like deionized water, it is non-conductive, but it lacks the deionizing process, so it may contain some impurities. There are coolants that are a mixture of water and additives to improve heat transfer, inhibit microbial growth, and protect against corrosion. They come in various colors for aesthetic purposes. There are also glycol-based coolants-similar to what is used in automotive antifreeze. These coolants have anti-corrosion and anti-freezing properties, making them suitable for extreme temperature conditions. In some niche applications, mineral oil is used as a coolant. Immersing the entire system in mineral oil provides excellent heat dissipation but requires a special setup. Many companies offer specialized coolants designed for electronics cooling. Fluorinert, sold by 3M, is a brand of electrically insulating, thermally conductive fluid designed for cooling electronics. These are typically expensive and used in specialized applications, such as data centers and supercomputers. Novec, also by 3M, is another brand of engineered fluid designed for electronics cooling. These are non-conductive and have low global warming potential, making them environmentally friendly. Green Revolution Cooling (GRC) offers a line of single-phase liquid immersion cooling fluids called ElectroSafe. With ElectroSafe, components are completely immersed in a steady-flowing dielectric coolant, which has 1,200 times the heat capacity of air. In any event, when selecting a coolant, factors such as electrical conductivity, specific heat, kinematic viscosity, thermal conductivity, corrosion resistance, heat transfer properties, environmental impact, and cost may be considered. Additionally, any safety and environmental regulations related to the handling of coolants may also be considered.

Returning to FIG. 6, depicted is a motive component system (which may include a pressure regulator) 625 that helps circulate a coolant through a set of tubes 630. To aid in the dissipation of heat extracted from the computing system 605, the coolant flows through a radiator 610. In one or more embodiments, the radiator system 610 may include one or more fans 615 to help dissipate the heat. Also depicted in FIG. 6 is a reservoir 620, in which cooled liquid may reside as it flows through the system. While not depicted in FIG. 6, the system 600 may include one or more temperature sensors and or pressure sensors, which supply information to one of the control modules/controllers.

In one or more embodiments, the radiator may be positioned in a traditional location near the front of the vehicle to receive incoming air flow as the vehicle moves to further aid in the removal of heat from the coolant. Alternatively, the radiator may be located at different places within the vehicle, including being integrated into or with the bumper or at other locations. In one or more embodiments, one or more radiators may be used; similarly, one or more additional other components may be used such as additional reservoirs, motive components, and/or pressure regulators.

In one or more embodiments, the relative positions of at least some of the components depicted in FIG. 6 may be designed to aid in thermal flow of the coolant. For example, if the motive component (i.e., pump) fails for some reason, it may be configured to have its valves remain open by default. In such a configuration and with the computing system located below the radiator and reservoir, a thermal flow will cause the coolant to circulate. That is, the hot liquid will rise to the radiator and the cooled liquid exiting the radiator and, in the reservoir, will be denser and will drop to the computing system—even if the motive component is nonoperational.

In one or more embodiments, a linear drive actuator may be employed as the pump 625 to circulate cooling liquid to the computer case 605. Such a system uses fewer parts compared to current designs and can utilize a smaller motor. In addition, by utilizing such a device, noise, vibration, and harshness (NVH) levels can be reduced (e.g., less than 33 dB in some tests performed using an embodiment of the current patent document). Table 1 summarizes some benefits of using a linear drive actuator versus current cooling systems that use a rotary pump.

TABLE 1

| Comparison of Current Designs to Linear Drive Actuator (LDA) Embodiments | | |
| --- | --- | --- |
| | Current Cooling Systems | LDA Embodiments |
| NVH | ~50-111.3 dB (Typical: 80-85 dB) | <10 db-33 db (typical: 20 db) |
| Efficiency | 50-80% | 90-96% |

TABLE 1-continued

| Comparison of Current Designs to Linear Drive Actuator (LDA) Embodiments | | |
|---|---|---|
| | Current Cooling Systems | LDA Embodiments |
| Cost | Requires more parts (e.g., pump and pressure regulator sensors); requires larger motor; more costly to maintain/repair | Fewer parts; requires smaller motor; easier to maintain |
| Speed | 6 liters/minute | 10 liters/minute |
| Motor Size | 60 watts | 45 watts |
| Failure Safety | n/a | Yes |
| Pressure Control | n/a | Can control motor to control pressure |
| Life Expectancy | ~2400 hours | Last as long as the vehicle (i.e., lifetime) |

Linear drive actuators are devices that convert rotary motion into linear motion. There are several types of linear drive actuators. Some common types include, but are not limited to, the following. Screw-driven actuators (e.g., lead screw actuators, ball screw actuators, acme screw actuator, etc.) use a threaded screw to convert rotational motion into linear motion. Such devices provide high precision, high efficiency, and reduced friction. Another type of actuator is belt-driven actuators. Belt-driven or mechanical actuators, whether using belts, gears, or chain-driven actuators, convert rotary motion into linear motion. Linear motor actuators (e.g., voice coil actuators, linear induction motors, etc.) exploit coils and electromagnetics to generate linear motion. Finally, hydraulic or pneumatic actuators use either pressurized fluid or air (respectively) to produce linear motion.

Figures 7A, 7B:
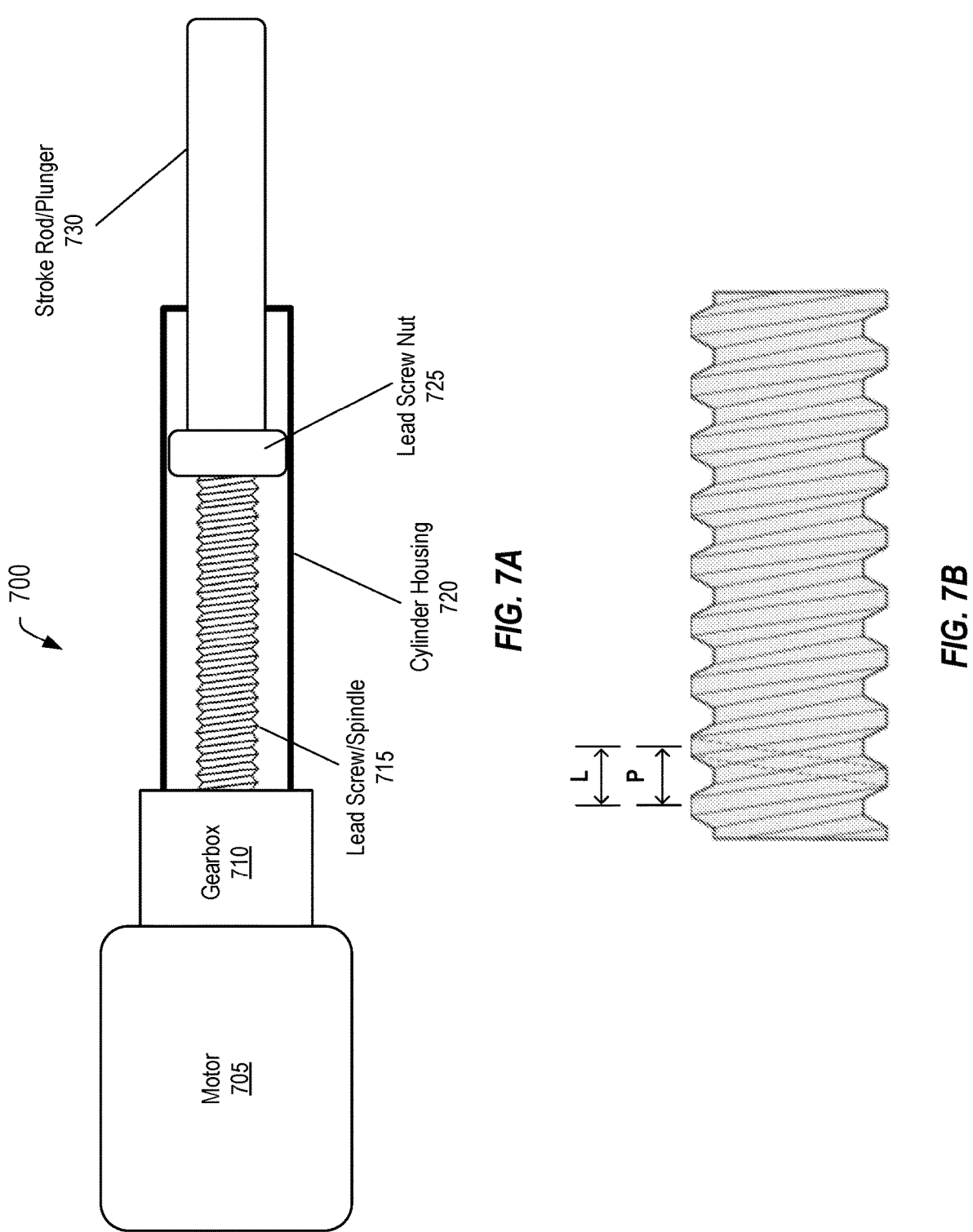
FIG. 7A depicts a partial cross-section view of an example of linear drive actuator, according to embodiments of the present disclosure.
FIG. 7B depicts a close-up view of a lead screw threading, according to embodiments of the present disclosure.

FIG. 7A depicts a partial cross-section view of an example of linear drive actuator, according to embodiments of the present disclosure. The depicted example is a lead screw linear actuator 700, which is a mechanical device that converts rotary motion into linear motion. It is a cost-effective mechanism that may be used in applications that require linear motion. An electric motor 705 is used to provide rotational force to turn a lead screw (or spindle) 715. The system 700 may include a gearbox 710 or connection interface between the motor 705 and the lead screw 715. For example, a clutch system may be included in connection between the motor and lead screw that can prevent damage by slipping if excess pressure exists on the stroke rod 730.

The lead screw 715 is a central component of the linear actuator. Typically, it is a rod with threading that runs along its length. The pitch (i.e., the distance between successive threads) of the lead screw directly relates to how much linear motion is achieved for each revolution. As the lead screw 715 is rotated by the motor 705, its rotation drives the linear motion of the actuator. A nut 725 on the lead screw has matching threading that engages with the threads of the lead screw, and as the lead screw rotates, the nut moves along the lead screw's axis, causing linear motion. The nut guides the linear motion and provides support for the load being moved. In the depict example, attached to the nut is a stroke rod/plunger 730 that is moved linearly inward or outward from the cylinder housing 720 as the lead screw turns. That is, depending upon the direction of rotation of the lead screw, the rod 730 is either moved inward or outward. The rod can exert force on a part to cause work to be performed.

It shall be noted that the linear actuator may include additional components. These additional components may include (but are not limited to) bearings (e.g., to provide support for the lead screw and to help reduce friction); limit switches (e.g., to restrict or limit the travel stroke of the rod);

position sensors (e.g., to accurately determine position of the stroke rod); cooling system (e.g., for cooling the motor and motion of the rod); etc.

FIG. 7B depicts a close-up view of a lead screw threading, according to embodiments of the present disclosure. For a lead screw, pitch is the distance between screw threads and is commonly used with millimeter (mm) sized products and specified as threads per mm. A lead is the linear travel the nut makes per one screw revolution and is how ball screws are typically specified. For a single start thread, the lead is equal to the pitch. For multiple start screws, the lead is the pitch multiplied by the number of starts.

Figure 8:
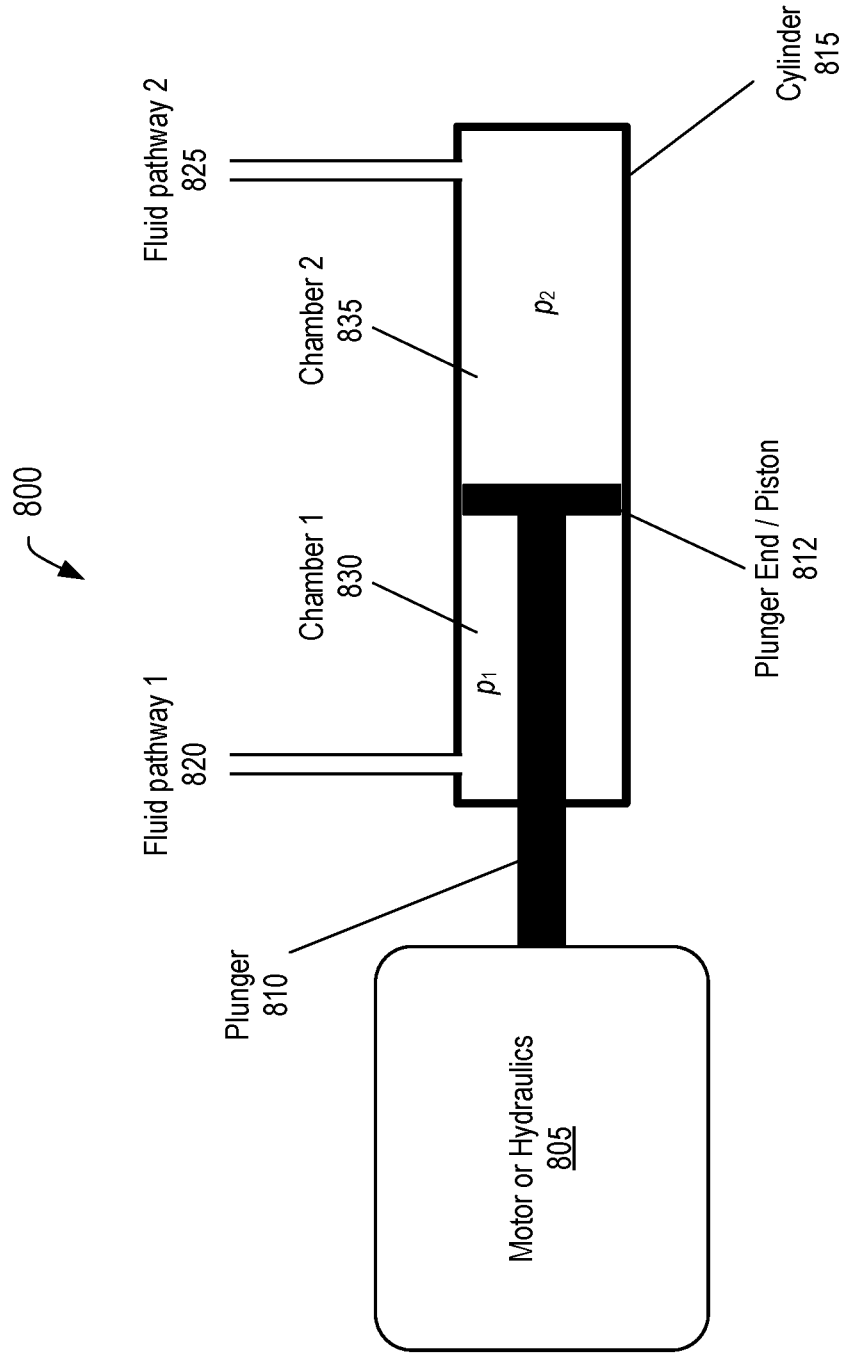
FIG. 8 depicts a partial cross-section view of an example of electro-hydraulic linear drive actuator, according to embodiments of the present disclosure.

FIG. 8 depicts a partial cross-section view of an example of electro-hydraulic linear drive actuator, according to embodiments of the present disclosure. The depicted example comprises an electric motor 805, which is used to drive the linear motion of plunger 810. It should be noted that hydraulics may be used to drive the plunger. The system 800 may include a connection interface (e.g., gearing, linear actuator, etc.) between the motor 805 and the plunger 810. The plunger 810 is driven within a cylinder 815 that houses a fluid or fluids. The plunger's end 812 divides the interior of the cylinder 815 into two chambers, chamber 1 830 and chamber 2 835. As the plunger moves, it pushes fluid from one chamber and pulls fluid into the other chamber via openings in each of the respective chambers. For example, if the plunger 810 is moved to the right, it forces fluid out of chamber 2 835 via pathway/opening 825 and pulls fluid into chamber 1 830 via pathway/opening 820. Note that there may be different resultant pressures (e.g., $p_1$ for chamber 1 and $p_2$ for chamber 2). Note also that in the full hydraulic system, the fluid itself may be used to drive the plunger. Such systems may also include a spring system (e.g., a spring in chamber 2) to put pressure to return the plunger to the left if force/pressure on the plunger is relieved.

As will be explained in more detail below, a linear actuator may be used to push/pull coolant for cooling a computing system.

Figure 9A:
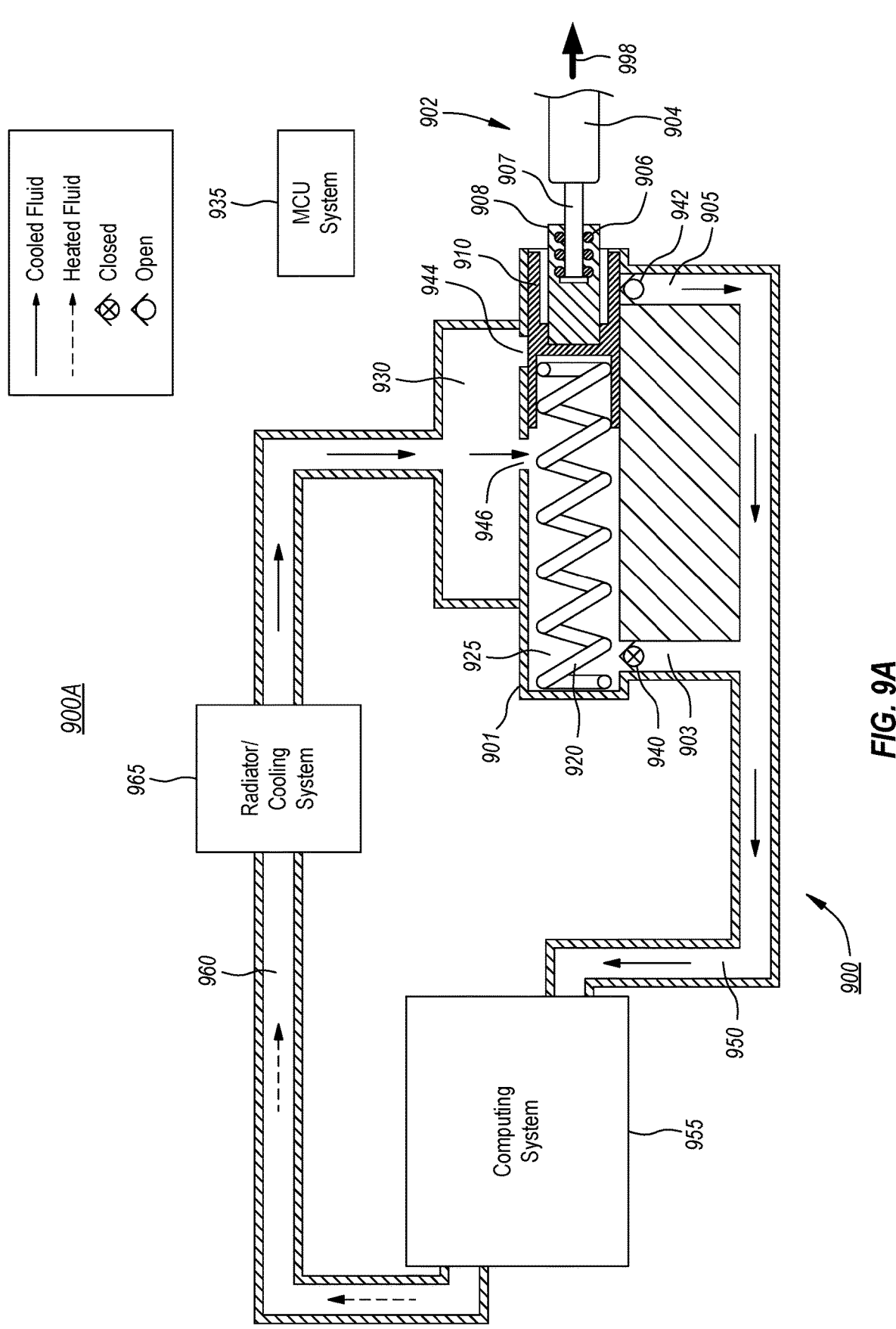
FIGS. 9A and 9B depict two states of an embodiment of a cooling system with a linear actuator, according to embodiments of the present disclosure.
Figure 9B:
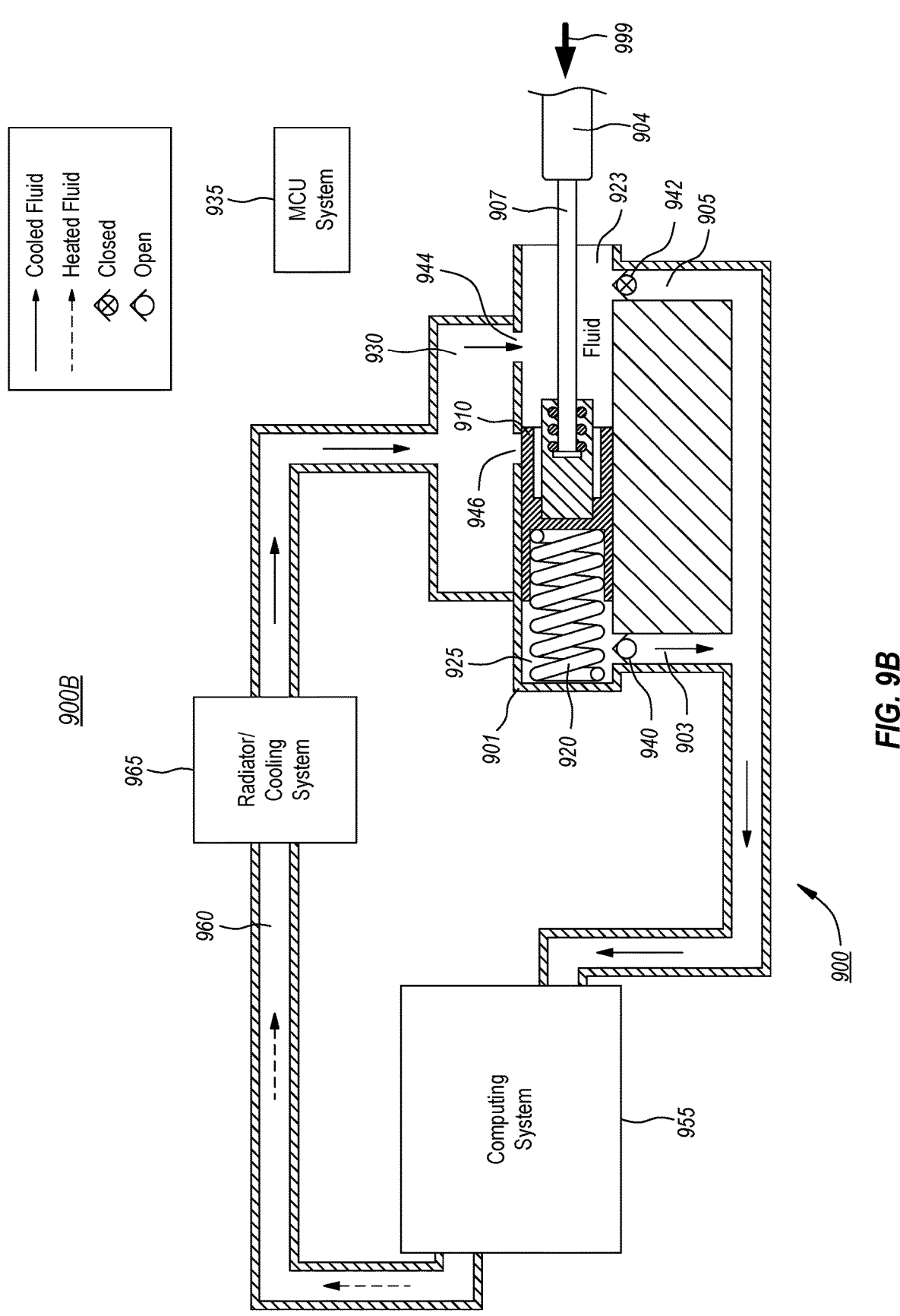

FIGS. 9A and 9B depict two states of an embodiment of a cooling system with a linear actuator, according to embodiments of the present disclosure. Starting with FIG. 9A, depicted is a cooling system that uses a linear actuator 902. In one or more embodiments, the linear actuator comprises a housing 901, a moveable plunger 907 within the housing. The plunger may comprise a piston 908/910 at one end of the plunger that divides the housing into a first chamber 925 and a second chamber 923 (FIG. 9B). The linear actuator 902 includes a motive component 904, which may be an electric motor or a hydraulic actuator.

A controller (e.g., microcontroller unit (MCU) 935) may be used to control the rate at which the motive component 904 is activated and the direction of the motion. The motive component 904, as controlled by the MCU 935, moves the plunger in a first and second directions (e.g., to the left or right). FIG. 9A illustrates the plunger 907 and piston 910/908 attached to the end of the plunger moving to the right 998. FIG. 9B illustrates the plunger 907 and piston 910 moving to the left 999. It shall be noted that different versions of linear actuator may be utilized. In one or more embodiments, the linear actuator may include bearings 906 that help reduce friction as the plunger moves left and right.

In the depicted embodiments, the housing 901 comprises a first inlet 946 for receiving fluid that has been cooled into the first chamber 925 of the housing, a second inlet 944 in the housing for receiving fluid that has been cooled into the second chamber of the housing. The housing 901 also includes a first outlet 903 in the housing for providing an outlet of the fluid from the first chamber toward a device to be cooled (e.g., computing system 955), and a second outlet 905 for providing an outlet of the fluid from the second chamber.

As depicted in FIG. 9B, when the motive component 904 moves the plunger and piston to the left 999, the cooled fluid is forced outward from the first chamber 925 via the first outlet 903 by the piston 910 moving in the first direction (e.g., to the left 999), and cooled fluid is drawn into the second chamber 923 via the second inlet 944.

As depicted in FIG. 9A, when the motive component 904 moves the plunger and piston to the right 998, the cooled fluid is forced outward from the second chamber 923 via the second outlet 905 by the piston 910 moving in the second direction (e.g., to the right 998), and cooled fluid is drawn into the first chamber 925 via the first inlet 946 to re-fill the first chamber 925.

The cooling system 900 further comprises a pathway system that facilitates fluid flow from the first and second chambers of the housing 901 across at least part of the computing system 955 that is to be cooled to allow the fluid to absorb heat from the computing device. The pathway system also facilitates fluid flow from a radiator system 965 back to the housing 901. In one or more embodiments, the pathway system may be tubes, piping, channels, or any combination thereof.

In one or more embodiments, the radiator system receives the fluid that has been heated by the computing device and helps dissipate heat from the fluid. In one or more embodiments, the radiator system may include one or more fans to help dissipate the heat from the fluid.

The cooling system may further comprise a reservoir 930 that is coupled via the pathway system to receive and hold surplus fluid from the radiator system 965 that has been cooled and that is coupled to supply the cooled fluid to the housing.

In one or more embodiments, the piston 901 may be configured geometrically (e.g., with a flange or flanges) to block the first inlet 946 or the second outlet 905 for at least part of a first travel when it is moved in one direction and/or may be configured to block the second inlet 944 or the first outlet 903 for at least part of a second travel when it is moved in an opposite direction to direct the fluid to exit one chamber and fill the other chamber.

Alternatively or additionally, the cooling system may comprise one or more valves that may be controlled by direct flow. For example, the first outlet 903 and the second outlet 905 may each include a valve 940 and 942, respectively. As depicted in FIG. 9A, the first outlet valve 940 may be closed while the first inlet 946 is open so that cooled fluid from the reservoir may pool into the first chamber 925 while the plunger moves to the right. Also, as the plunger moves to the right 998, the piston forces the cooled fluid out of the second chamber via the open valve 942 of the second outlet 905. Note also that the piston flange blocks the second inlet 944 during this motion.

FIG. 9B shows the operation when the linear actuator moves to the left 999. As depicted in FIG. 9B, the first outlet valve 940 is now open while the first inlet 946 is close (i.e., is blocked by the piston 910) so that cooled fluid in the first chamber 925 is pushed into the first outlet of the pathway system. Note that, during the operation, the second chamber 923 fills with cooled fluid from the reservoir 930 via the second inlet 944, and to stop fluid from being diverted back into the second chamber from the first chamber, the second outlet valve 942 may be set to a closed position. While not depicted in this embodiment, one or more of the inlets may include a valve. In one or more embodiments, the valve operation may be controlled by the controller (e.g., MCU 935); alternatively, one or more of the valves may be one-way valves that function automatically to only allow flow in one direction.

It shall be noted that the controller may control the rate at which the piston is moved in the first and second directions to affect the rate of cooling of the device. Also, the controller may control the rate at which the piston is moved in the first and second directions to affect pressure of the fluid as it flows by the device.

Figure 10A:
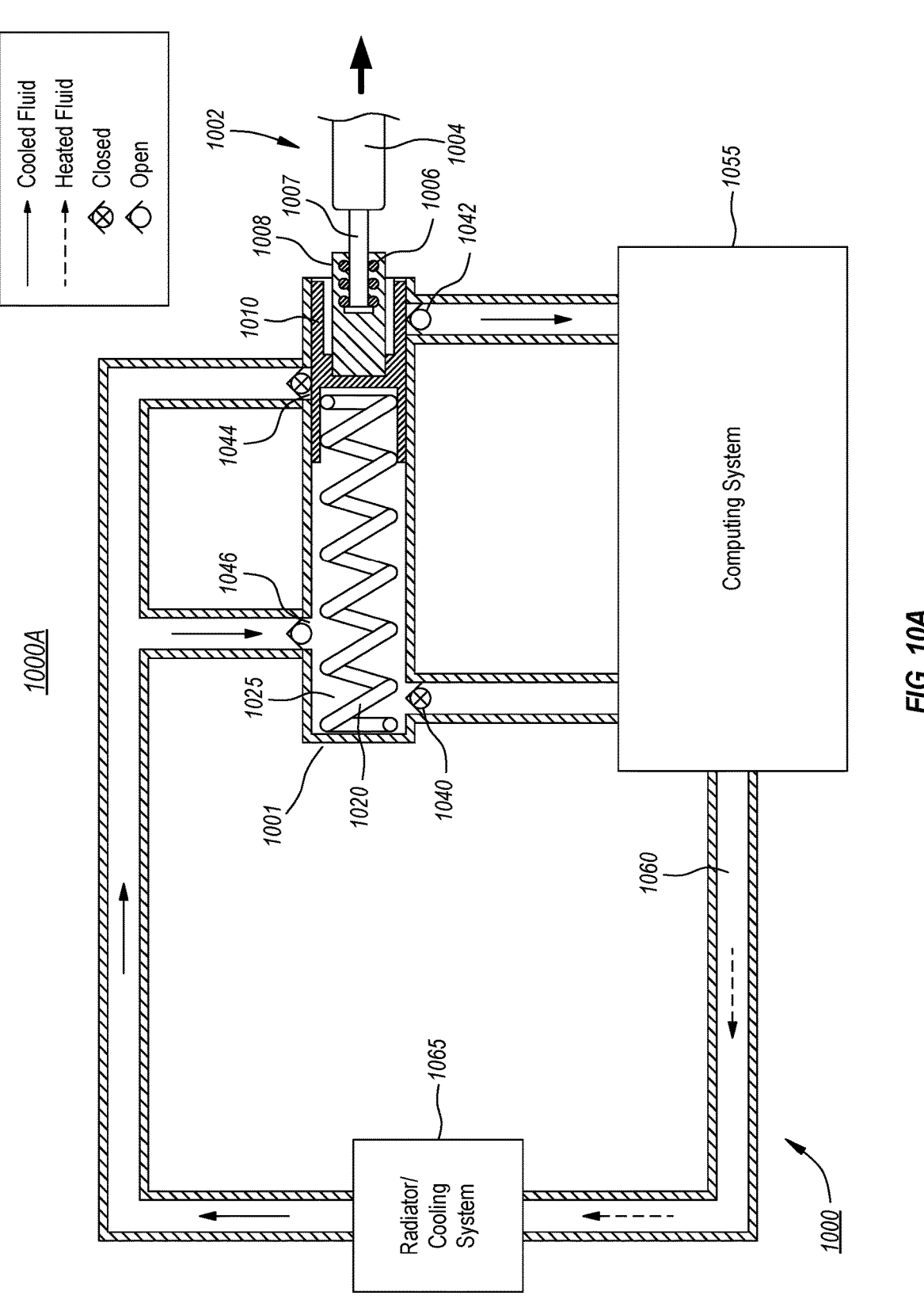
FIGS. 10A and 10B depict two states of an alternative embodiment of a cooling system with a linear actuator, according to embodiments of the present disclosure.
Figure 10B:
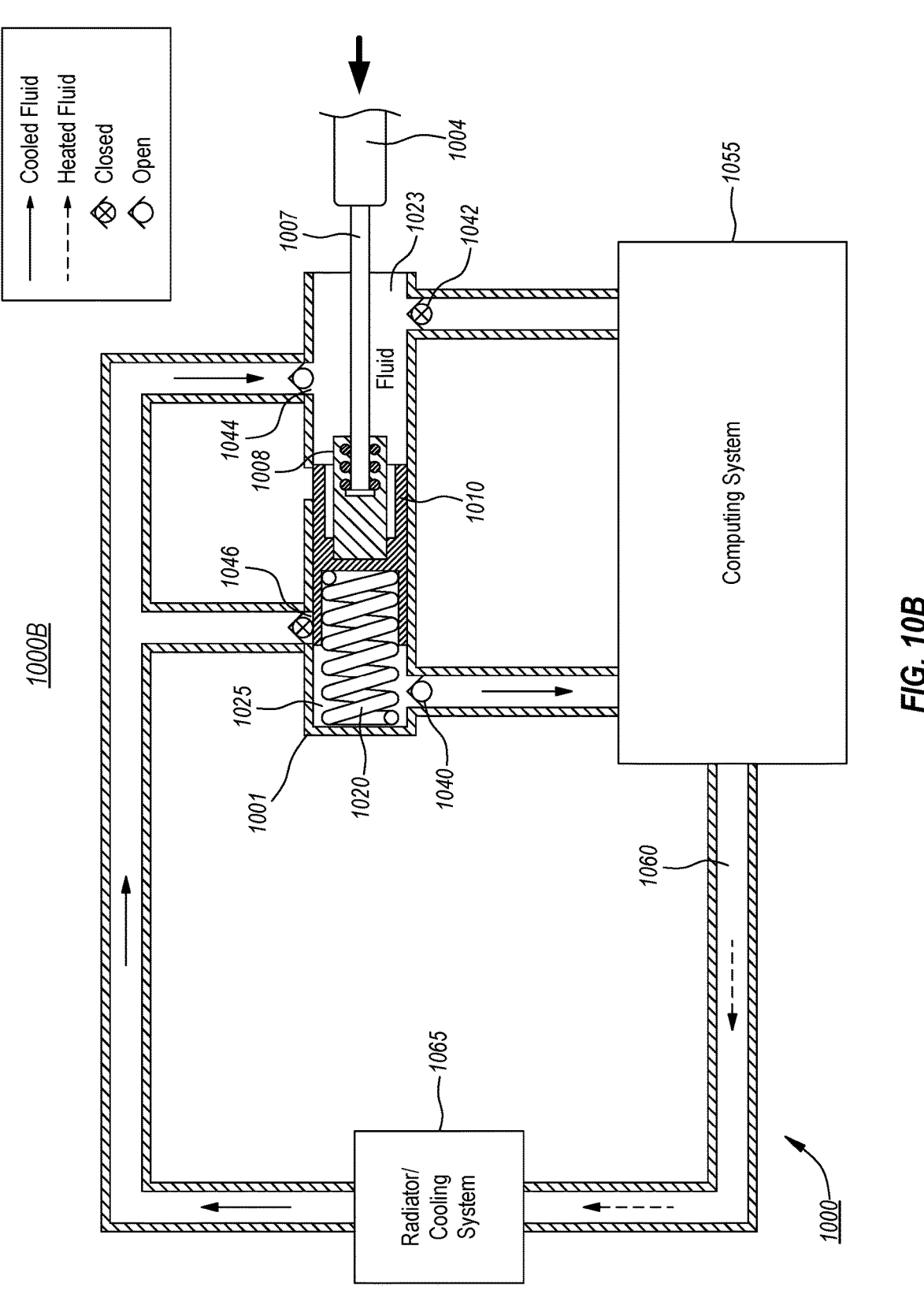

FIGS. 10A and 10B depict two states of an alternative embodiment of a cooling system with a linear actuator, according to embodiments of the present disclosure. The depicted embodiment of FIGS. 10A and 10B include the same or similar linear actuator system elements of FIGS. 9A and 9B. However, the depicted embodiment of FIGS. 10A and 10B include valves for the inlets (i.e., valve 1046 and valve 1044) and does not include a distinct reservoir (although one or more reservoirs may be included). Not depicted in FIGS. 10A and 10B is a controller or controllers for controlling at least the linear actuator 1002.

As depicted in FIG. 10A, the first outlet valve 1040 is closed while the first inlet 1046 is open so that cooled fluid from the pathway system may be drawn into the first chamber 1025 while the plunger moves to the right. Also, as the plunger moves to the right, the piston 1010 forces the cooled fluid out of the second chamber 1023 (FIG. 10B) via the open valve 1042 of the second outlet. Note also that the piston flange could be shortened in this embodiment because of the valves at all inlets and outlets. Alternatively, one or more valves may be removed, and the flange of the piston may act to block an inlet, an outlet, or both.

As depicted in FIG. 10B, the cooling system still causes fluid to flow in the same direction of the pathway system when the plunger 1007 moves in the opposite direction (i.e., when the linear actuator moves to the left. The first outlet valve 1040 is now open while the first inlet 1046 is close so that cooled fluid in the first chamber 1025 is pushed into the first outlet of the pathway system. Note that, during the operation, the second chamber 1023 fills with cooled fluid from the pathway system via the second inlet 1044, and to stop fluid from being diverted back into the second chamber from the first chamber, the second outlet valve 1042 is in a closed position. In one or more embodiments, the valve operation may be controlled by the controller; alternatively, one or more of the valves may be one-way valves that function automatically to only allow flow in one direction.

In one or more embodiments, the cooling system 1000 may be configured to be robust and account for issues of failure. For example, in one or more embodiments, in the event of a motor actuator or MCU malfunction, the system may automatically open ports to maintain basic functionality through thermal density flow. To cause the piston to move to a set position, the housing may include a spring 1020 that exerts force upon the plunger or piston to cause the plunger to be moved to a position that allows cooled fluid to flow through the first chamber, the second chamber, or both. To aid in the circulatory flow, a reservoir or fluid in the pathway system may be positioned at a height above the housing 1001 and the computing device 1055 may be positioned at a height below the housing 1001 to facilitate circulation of the fluid through the cooling system by having the cooled fluid, which is cooled and denser than when the fluid has absorbed heat from the device, sink through the housing across the computing system 1055, which heats the fluid and causes it to rise to the radiator system. Note that radiator system 1065 may be positioned at a height above the housing 1001 to further help with circulation when in such a mode.

In one or more embodiments, to help design or select an appropriate linear actuator, the following computations for a ball screw linear actuator may be considered. When selecting a servo motor, the following formula may be used:

$$T = \left\{ \frac{F_m \cdot P_h}{2\pi \cdot \eta} \times \frac{1}{A} \right\} + \left\{ \left( \left( m \cdot \left( \frac{P_h}{2\pi} \right)^2 + J_B + J_s \right) \times \frac{1}{A^2} \right) + (J_a + J_b) \right\} \times \omega''$$

Where:

| | Content | Unit | Notes |
|---|---|---|---|
| T | Required torque of motor | Nm | |
| $F_m$ | External load force due to linear motion part | N | If horizontal, friction force; if vertical, gravity |
| $P_h$ | Ball screw lead pitch | m | |
| η | ball screw efficiency | dimensionless | 0.9~0.95 |
| A | Reduction ratio | dimensionless | |
| m | Mass of linear moving part | Kg | |
| $J_B$ | Moment of inertia of ball screw | Kg · m² | |
| $J_s$ | Moment of inertia of other rotating parts | Kg · m² | E.g., inner ring of angular bearing; inner ring of deep groove ball bearing; bearing nut; coupling etc. |
| $J_a$ | Moment of inertia of reducer (if present) | Kg · m² | Typically obtained from supplier catalog information |
| $J_b$ | Motor shaft moment of inertia | Kg · m2 | Typically obtained from supplier catalog information |
| ω" | angular acceleration | 1/sec² | |

The first term, namely $$\left\{ \frac{F_m \cdot P_h}{2\pi \cdot \eta} \times \frac{1}{A} \right\},$$

is used to calculate an external load torque and the remainder of the equation represents the acceleration torque calculation.

By way of example, consider the following values:
Device:
    1. Diameter of 80 mm
    2. Pitch of 2 mm
    3. Roll_Number of 50.

Motor: 1200 RPM
Constants
    1. Pressure: 0.1 MPa
    2. Efficiency: 98%
Acceleration
    1. Weight=5 kg
    2. $P_h$=2 mm
    3. $J_B$=0.0000993
    4. $J_s$=0.00001
    5. $J_a$=0.00001
    6. $J_b$=0.000230088
Time=0.1.
A=1

The Volume per Full Process may be determined as follows:

$$V = \pi \times \left( \frac{\text{Diameter}}{1000} \right)^2 \times (\text{Pitch}/1000) \times \text{Rolling\_Number}$$

$$V = 0.000502655 \text{ m}^3 = 0.502655 \text{ liters}$$

The Process per Minute may be determined as follows:

$$\text{Process/min} = RPM/\text{Pitch}/\text{Rolling\_Number}$$

$$\text{Process/min} = 12 \text{ times}$$

The Maximum Volume may be determined as follows:

$$\text{Max Volume} = \frac{\text{Process per Minute}}{\text{Volume per Full Process}}$$

$$\text{Max Volume} = 0.00603186 \text{ m}^3 = 6.03186 \text{ liters}$$

The Force may be determined as follows:

$$\text{Force} = \frac{\text{Pressure} \times 10^6}{2} \times \pi \times \left( \frac{\text{Diameter}}{1000} \right)^2$$

-continued

Force = 1005.31 N

The Torque may be determined as follows:

$$Torque = \frac{Force \times Pitch}{1000}/(2 \times \pi \times Efficiency)$$

$$Torque = 0.326530612 \; Nm$$

The Constant Torque may be determined as follows:

$$Constant \; Torque = \frac{Torque \times RPM}{9.5488}$$

$$Constant \; Torque = 41.03518083 \; Watt$$

The Bearing Moment may be determined as follows:

$$Bearing \; Moment = Weight \times (Pitch/1000/2/\pi)^2$$

$$Bearing \; Moment = 5.06606 \times 10^{-7}$$

The Total Acceleration Moment may be determined as follows:

$$Total \; Acc. \; Moment = \frac{(Bearing \; Moment + J_B + J_S)}{A^2} + J_a + J_b$$

$$Total \; Acc. \; Moment = 0.000349895$$

The Rad Acceleration may be determined as follows:

$$Rad \; Acc. = \frac{2 \times \pi}{Time}$$

$$Rad \; Acc. = 62.831852$$

The Acceleration Torque may be determined as follows:

$$Acc \; Torque = Total \; Acc. \; Moment \times Rad \; Acc.$$

$$Acc \; Torque = 0.021984522 \; Nm$$

The Final Torque may be determined as follows:

$$Final \; Torque = Torque + Acc \; Torque$$

$$Final \; Torque = 0.348515134$$

The Final Power may be determined as follows:

$$Final \; Power = Final \; Torque \times RPM/9.5488$$

$$Final \; Power = 43.79798097$$

Figure 11:
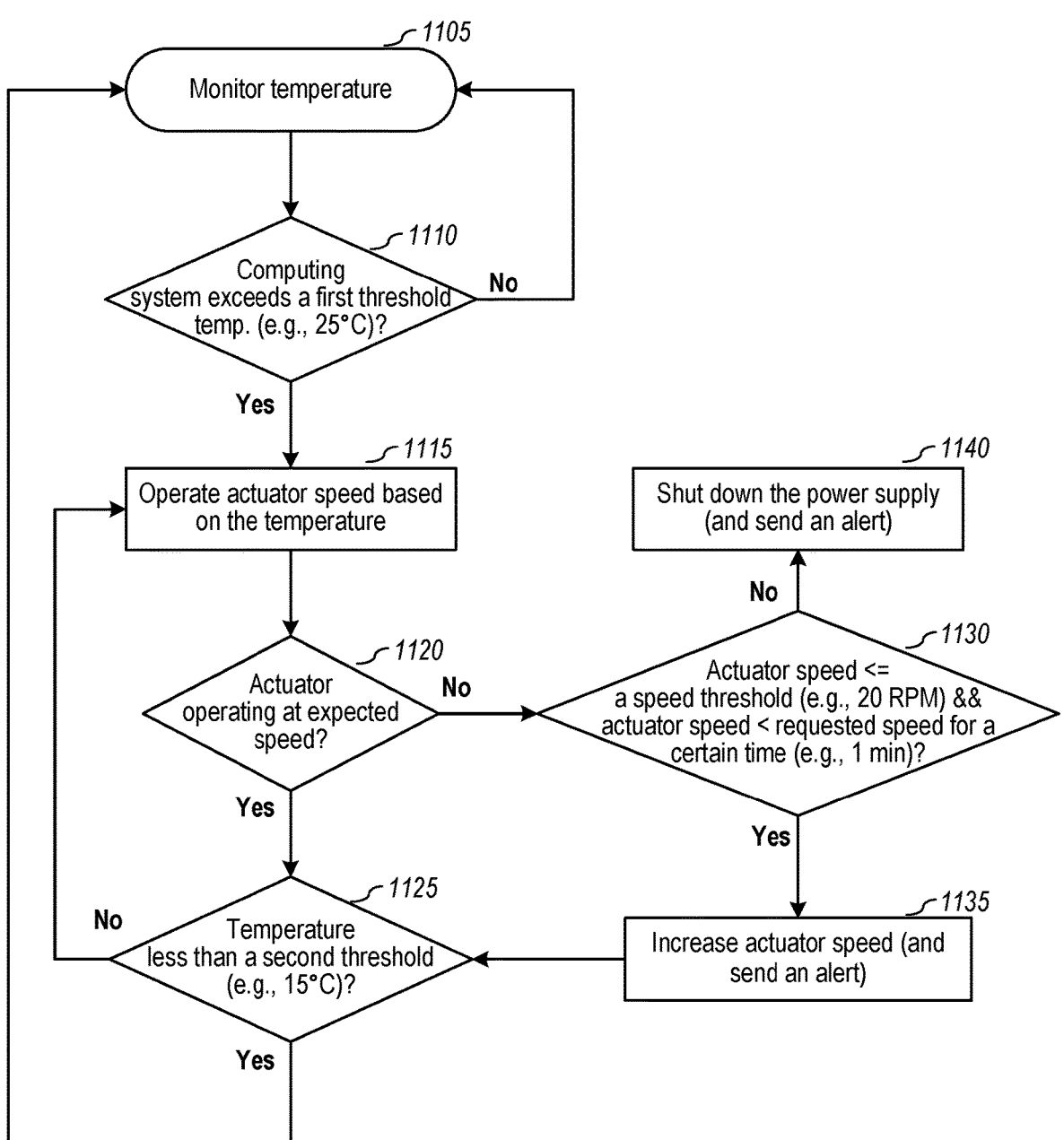
FIG. 11 depicts a method for cooling a computing system, according to embodiments of the present disclosure.

FIG. 11 depicts a method for cooling a computing system, according to embodiments of the present disclosure. In one or more embodiments, a controller may monitor (1105), using one or more thermal sensors, a temperature of a computing system. If the temperature associated with the computing system does not exceed (1110) a first threshold temperature, the controller may continue to monitor (1105) the temperature of the computing system.

Figure 12:
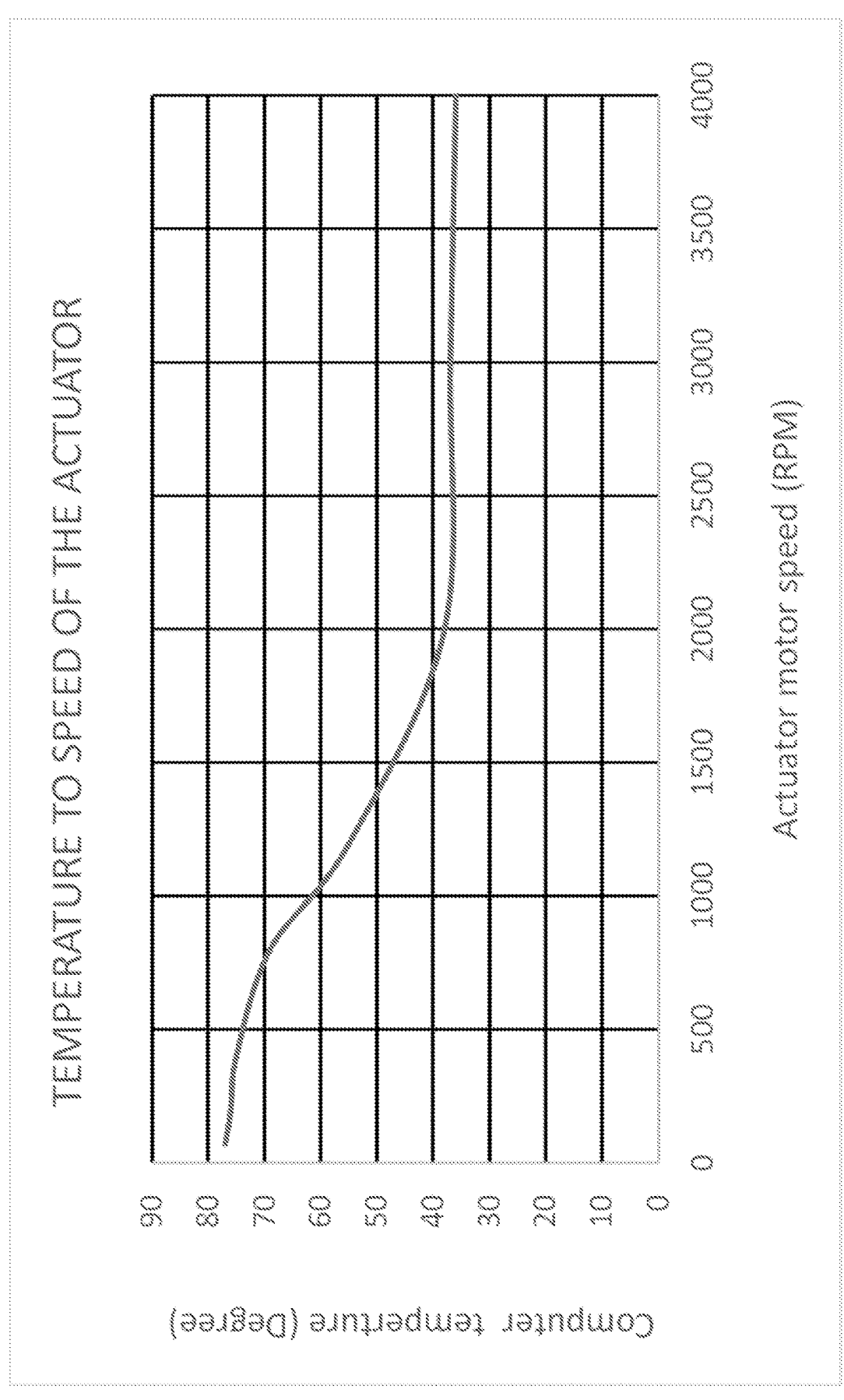
FIG. 12 presents a graph for converting temperature to speed for an actuator, according to embodiments of the present disclosure.

If the temperature associated with the computing system exceeds (1110) a first threshold temperature (e.g., 25° C.—although it shall be noted that the temperature threshold may be set relative to the sensitivity of components in the computing device or desired operating temperature range), the controller causes the actuator of a cooling system to increase (1115) its speed to a requested speed. In one or more embodiments, the speed may be related to the temperature. For example, a table or formula (or set of tables or formulas) may be used to set the speed relative to temperature (and may include one or more additional other factors, such as time, ambient temperature, etc.). In one or more embodiments, the table(s) may have different functions or values, including step or interval values or functions. For example, a chart, such as that depicted in FIG. 12, may be used. The chart assumes 6 liters flow into the computer system, and the max. temperature may be about 55 degrees.

Following issuance of a signal to the motor of the actuator to increase speed, the speed of the actuator may be monitored (1120) to determine if it has achieved the requested speed. Responsive to the speed of the actuator achieving the requested speed, the temperature of the computing system may continue to be monitored. If the temperature is (1125) still above an operating or second threshold (e.g., 15° C.), the processing of monitoring the temperature and adjusting (1115) the speed of the actuator relative to the measure temperature according to a table or formula may continue. If the temperature is (1125) at or below an operating or second threshold (e.g., 15° C.), the processing may return (1105) to monitoring the temperature.

Responsive to the speed of the actuator not reaching (1120) the requested speed, the controller may determine (1130) whether the actuator speed is less than a speed threshold (e.g., 20 revolutions per minute (RPM), which may be a maximum speed) and that the actuator speed is less than the requested speed threshold. If those conditions are present (i.e., the actuator is not at its maximum speed and is less than the requested speed), the controller may then try to increase (1135) the speed of the actuator. In one or more embodiments, the controller may also cause an alert to be generated. In one or more embodiments, the alerts may be used to trigger one or more warning signals or warning/failure signals to a user, passenger, and/or remote user. Such warnings may comprise one or more media types (e.g., lights, sounds, messages, etc.). For example, a message may include a light signal, a text message, an audible signal, a tactile signal, a network message, an application message, an email, or any combination thereof. In one or more embodiments, the alert(s) may be different based on different detected failures.

However, if the actuator is at its maximum speed or has failed to reach the requested speed within a first threshold time (e.g., one minute), there may be an issue with the linear actuator, the controller (e.g., signal from the controller), or both. In such cases, the computing system may be shut down (1140) to stop it from overheating and damaging components. In one or more embodiments, one or more alerts may be generated in like manner as described above. A failure message may be sent to notify a user, a passenger, and/or an administrator. The alert may indicate a failure of the cooling system. It shall be noted that in cases of the where the computing system is performing a critical operation or operations (e.g., driving the vehicle), an alert may also trigger one or more actions, such as a safety shutdown procedure (e.g., slow vehicle, find location to park, park vehicle, shutdown computing system).

D. Computing System Embodiments

In one or more embodiments, aspects of the present patent document may be directed to, may include, or may be implemented on or use one or more computing systems. An information handling system/computing system may include any instrumentality or aggregate of instrumentalities operable to compute, calculate, determine, classify, process, transmit, receive, retrieve, originate, route, switch, store, display, communicate, manifest, detect, record, reproduce, handle, or utilize any form of information, intelligence, or data. For example, a computing system may be or may include a specialized processor-enabled computing system, a personal computer (e.g., laptop), tablet computer, mobile device (e.g., personal digital assistant (PDA), smartphone, phablet, tablet, etc.), smartwatch, server (e.g., blade server or rack server), a network storage device, camera, or any other suitable device and may vary in size, shape, performance, functionality, and price. The computing system may include random access memory (RAM), one or more processing resources such as a central processing unit (CPU) or hardware or software control logic, read-only memory (ROM), and/or other types of memory. Additional components of the computing system may include one or more drives (e.g., hard disk drive, solid-state drive, or both), one or more network ports for communicating with external devices as well as various input and output (I/O) devices, such as a keyboard, mouse, touchscreen, stylus, microphone, camera, trackpad, display, etc. The computing system may also include one or more buses operable to transmit communications between the various hardware components.

Figure 13:
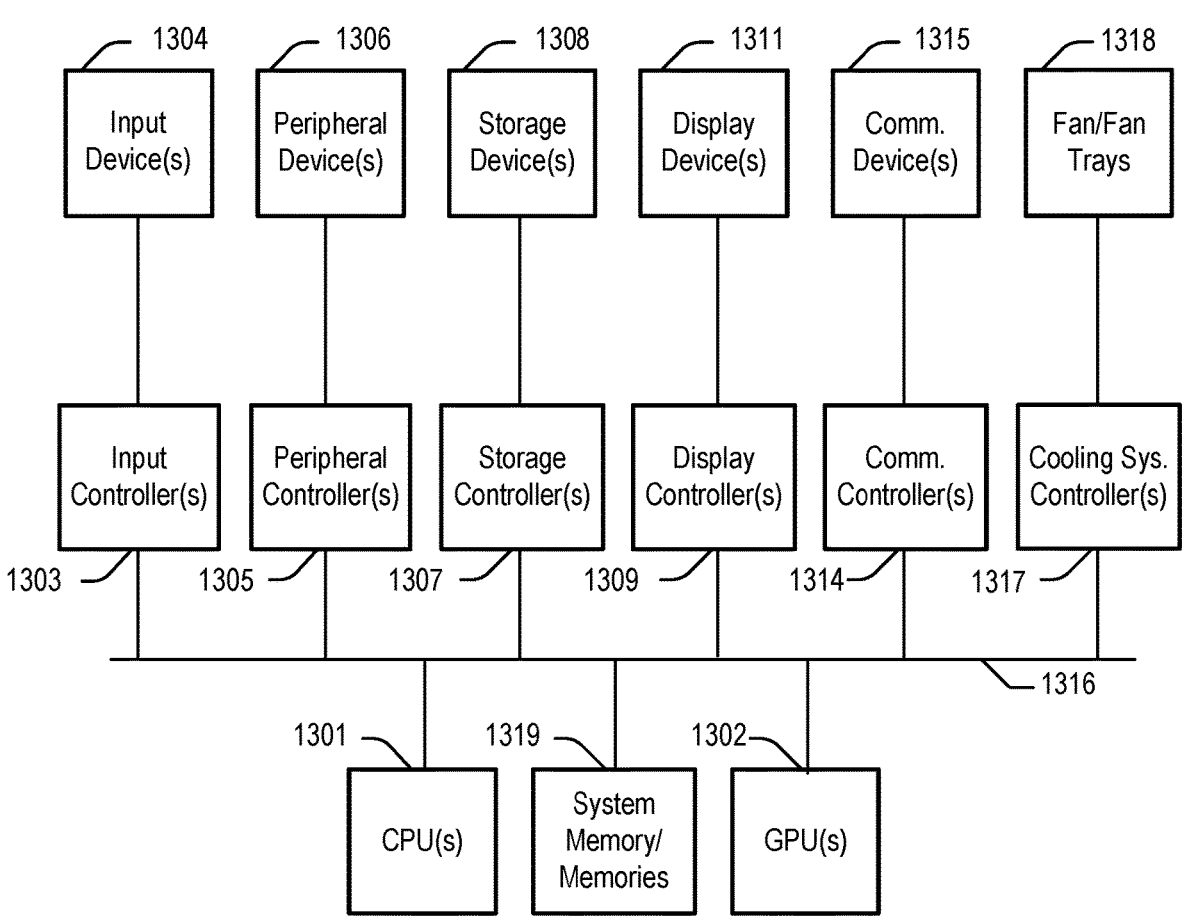
FIG. 13 depicts a simplified block diagram of a computing device, according to embodiments of the present disclosure.

FIG. 13 depicts a simplified block diagram of an information handling system (or computing system), according to embodiments of the present disclosure. It will be understood that the functionalities shown for system 1300 may operate to support various embodiments of a computing system—although it shall be understood that a computing system may be differently configured and include different components, including having fewer or more components as depicted in FIG. 13.

As illustrated in FIG. 13, the computing system 1300 includes one or more CPUs 1301 that provide computing resources and control the computer. CPU 1301 may be implemented with a microprocessor or the like, and may also include one or more graphics processing units (GPU) 1302 and/or a floating-point coprocessor for mathematical computations. In one or more embodiments, one or more GPUs 1302 may be incorporated within the display controller 1309, such as part of a graphics card or cards. The system 1300 may also include a system memory 1319, which may comprise RAM, ROM, or both.

A number of controllers and peripheral devices may also be provided, as shown in FIG. 13. An input controller 1303 represents an interface to various input device(s) 1304. The computing system 1300 may also include a storage controller 1307 for interfacing with one or more storage devices 1308 each of which includes a storage medium such as magnetic tape or disk, or an optical medium that might be used to record programs of instructions for operating systems, utilities, and applications, which may include embodiments of programs that implement various aspects of the present disclosure. Storage device(s) 1308 may also be used to store processed data or data to be processed in accordance with the disclosure. The system 1300 may also include a display controller 1309 for providing an interface to a display device 1311, which may be a cathode ray tube (CRT) display, a thin film transistor (TFT) display, organic light-emitting diode, electroluminescent panel, plasma panel, or any other type of display. The computing system 1300 may also include one or more peripheral controllers or interfaces 1305 for one or more peripherals 1306. Examples of peripherals may include one or more printers, scanners, input devices, output devices, sensors, and the like. A communications controller 1314 may interface with one or more communication devices 1315, which enables the system 1300 to connect to remote devices through any of a variety of networks including the Internet, a cloud resource (e.g., an Ethernet cloud, a Fiber Channel over Ethernet (FCoE)/Data Center Bridging (DCB) cloud, etc.), a local area network (LAN), a wide area network (WAN), a storage area network (SAN) or through any suitable electromagnetic carrier signals including infrared signals. As shown in the depicted embodiment, the computing system 1300 comprises one or more fans or fan trays 1318 and a cooling subsystem controller or controllers 1317 that monitors thermal temperature(s) of the system 1300 (or components thereof) and operates the fans/fan trays 1318 to help regulate the temperature.

In the illustrated system, all major system components may connect to a bus 1316, which may represent more than one physical bus. However, various system components may or may not be in physical proximity to one another. For example, input data and/or output data may be remotely transmitted from one physical location to another. In addition, programs that implement various aspects of the disclosure may be accessed from a remote location (e.g., a server) over a network. Such data and/or programs may be conveyed through any of a variety of machine-readable media including, for example: magnetic media such as hard disks, floppy disks, and magnetic tape; optical media such as compact discs (CDs) and holographic devices; magneto-optical media; and hardware devices that are specially configured to store or to store and execute program code, such as application specific integrated circuits (ASICs), programmable logic devices (PLDs), flash memory devices, other non-volatile memory (NVM) devices (such as 3D XPoint-based devices), and ROM and RAM devices.

Aspects of the present disclosure may be encoded upon one or more non-transitory computer-readable media with instructions for one or more processors or processing units to cause steps to be performed. It shall be noted that non-transitory computer-readable media shall include volatile and/or non-volatile memory. It shall be noted that alternative implementations are possible, including a hardware implementation or a software/hardware implementation. Hardware-implemented functions may be realized using ASIC(s), programmable arrays, digital signal processing circuitry, or the like. Accordingly, the "means" terms in any claims are intended to cover both software and hardware implementations. Similarly, the term "computer-readable medium or media" as used herein includes software and/or hardware having a program of instructions embodied thereon, or a combination thereof. With these implementation alternatives in mind, it is to be understood that the figures and accompanying description provide the functional information one skilled in the art would require to write program code (i.e., software) and/or to fabricate circuits (i.e., hardware) to perform the processing required.

It shall be noted that embodiments of the present disclosure may further relate to computer products with a non-transitory, tangible computer-readable medium that has computer code thereon for performing various computer-implemented/processor-implemented operations. The media and computer code may be those specially designed and constructed for the purposes of the present disclosure, or they may be of the kind known or available to those having skill in the relevant arts. Examples of tangible computer-readable media include, for example: magnetic media such as hard disks, floppy disks, and magnetic tape; optical media such as CDs and holographic devices; magneto-optical media; and hardware devices that are specially configured to store or to store and execute program code, such as ASICs, PLDs, flash memory devices, other non-volatile memory devices (such as 3D XPoint-based devices), and ROM and RAM devices. Examples of computer code include machine code, such as produced by a compiler, and files containing higher-level code that are executed by a computer using an interpreter. Embodiments of the present disclosure may be implemented in whole or in part as machine-executable instructions that may be in program modules that are executed by a processing device. Examples of program modules include libraries, programs, routines, objects, components, and data structures. In distributed computing environments, program modules may be physically located in settings that are local, remote, or both.

Note that some or all of the components as shown and described above may be implemented in software, hardware, or a combination thereof. For example, such components can be implemented as software installed and stored in a persistent storage device, which can be loaded and executed in a memory by a processor to carry out the processes or operations described throughout this application. Alternatively, such components can be implemented as executable code programmed or embedded into dedicated hardware such as an integrated circuit (e.g., an application-specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer-readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read-only memory ("ROM"), random access memory ("RAM"), magnetic disk storage media, optical storage media, flash memory devices).

The processes or methods depicted in the preceding figures may be performed by processing logic that comprises hardware (e.g., circuitry, dedicated logic, etc.), software (e.g., embodied on a non-transitory computer-readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. It is intended that all permutations, enhancements, equivalents, combinations, and improvements thereto that are apparent to those skilled in the art upon a reading of the specification and a study of the drawings are included within the true spirit and scope of the present disclosure. It shall also be noted that elements of any claims may be arranged differently including having multiple dependencies, configurations, and combinations. The specification and drawings are, accordingly, to be regarded in an illustrative sense rather than a restrictive sense.

What is claimed is:

1. A cooling system comprising:
a linear actuator comprising:
   a housing;
   a moveable plunger within the housing comprising a piston at one end of the plunger that divides the housing into a first chamber and a second chamber;
   a first inlet in the housing for receiving fluid that has been cooled into the first chamber of the housing;
   a second inlet in the housing for receiving fluid that has been cooled into the second chamber of the housing;
   a first outlet in the housing for providing an outlet of the fluid from the first chamber toward a device to be cooled;
   a second outlet in the housing for providing an outlet of the fluid from the second chamber toward the device to be cooled;
   a motive component for moving the piston in a first direction and a second direction; and
   a controller for controlling the motive component;
wherein:
   when cooled fluid is forced outward from the first chamber via the first outlet by the piston moving in a first direction, cooled fluid is drawn into the second chamber via the second inlet; and when cooled fluid is forced outward from the second chamber via the second outlet by the piston moving in a second direction opposite the first direction, cooled fluid is drawn into the first chamber via the first inlet; and a pathway system that:

facilitates fluid flow from the first and second chambers of the housing across at least part of the device to be cooled to allow the fluid to absorb heat from the device; and facilitates fluid flow from a radiator system back to the housing; and a radiator system for receiving fluid that has been heated by the device that facilitates dissipating heat from the fluid.

2. The cooling system of claim 1 further comprising a reservoir that is coupled via the pathway system to receive fluid from the radiator system that has been cooled and is coupled to supply the fluid that has been cooled to the housing.

3. The cooling system of claim 1 wherein the controller controls a rate at which the piston is moved in the first and second directions to affect pressure of the fluid as it flows by the device.

4. The cooling system of claim 1 further comprising a spring that exerts force upon the plunger or piston that causes, responsive to a failure of the motive component, the controller, or both, the plunger to be moved to a position that allows cooled fluid to flow through the first chamber, the second chamber, or both.

5. The cooling system of claim 4 further comprising:

a reservoir is coupled via a pathway system to receive fluid from a radiator system that has been cooled and is coupled to supply the fluid that has been cooled to the housing;

wherein the reservoir is positioned at a height above the housing and the device to be cooled is positioned at a height below the housing to facilitate circulation of the fluid through the cooling system by having the fluid in the reservoir, which is cooled and denser than when the fluid has absorbed heat from the device, sink through the housing into the device, which heats the fluid and causes it to rise to the radiator system.

6. The cooling system of claim 1 wherein the piston is configured to block the first inlet or the second outlet for at least part of a first travel when it is moved in one direction and to block the second inlet or the first outlet for at least part of a second travel when it is moved in an opposite direction to direct the fluid to exit one chamber and fill the other chamber.

7. The cooling system of claim 1 wherein:

the first inlet and the second inlet each comprises a valve;

the first outlet and the second outlet each comprises a valve; or the first inlet, the second inlet, the first outlet, and the second outlet each comprise a valve, wherein one or more of the valves are controlled by the controller to direct the fluid to exit one chamber and fill the other chamber.

8. The cooling system of claim 7 wherein one or more of the valves are one-way valves.

9. The cooling system of claim 1 wherein the motive component is an electric motor or a hydraulic actuator.

10. The cooling system of claim 1 further comprising a spring that exerts force upon the plunger or piston that causes, responsive to a failure of the motive component, the controller, or both, the plunger to be moved to a position that allows cooled fluid to flow through the first chamber, the second chamber, or both.

11. The cooling system of claim 1 wherein the controller controls a rate at which the piston is moved in the first and second directions to affect the rate of cooling of the device.

12. A method for cooling a computing system, the method comprising:

monitoring, using a thermal sensor, a temperature of a computing system;

responsive to detecting via a thermal sensor that the computing system exceeds a first threshold temperature:

causing, via a controller, an actuator of a cooling system to increase speed of the actuator to a requested speed;

determining a speed of the actuator; and responsive to the speed of the actuator not reaching the requested speed within a first threshold time:

determining whether the actuator speed is less than a speed threshold;

responsive to the actuator speed being less than the speed threshold, increasing the speed of the actuator; and responsive to the actuator speed being at least equal to the speed threshold, causing the computing system to be shut down; and responsive to detecting via a thermal sensor that the computing system is less than a second threshold temperature, returning to the step of monitoring the temperature of the computing system, wherein the actuator of the cooling system comprises:

a housing;

a moveable plunger within the housing comprising a piston at one end of the plunger that divides the housing into a first chamber and a second chamber;

a first inlet in the housing for receiving fluid that has been cooled into the first chamber of the housing;

a second inlet in the housing for receiving fluid that has been cooled into the second chamber of the housing;

a first outlet in the housing for providing an outlet of the fluid from the first chamber toward the computing system to be cooled;

a second outlet in the housing for providing an outlet of the fluid from the second chamber toward the computing system to be cooled; and a motive component for moving the piston in a first direction and a second direction;

wherein:

when cooled fluid is forced outward from the first chamber via the first outlet by the piston moving in a first direction, cooled fluid is drawn into the second chamber via the second inlet; and when cooled fluid is forced outward from the second chamber via the second outlet by the piston moving in a second direction opposite the first direction, cooled fluid is drawn into the first chamber via the first inlet.

13. The method of claim 12 wherein the cooling system further comprises:

a pathway system that:

facilitates fluid flow from the first and second chambers of the housing across at least part of the computing system to be cooled to allow the fluid to absorb heat from the computing system; and facilitates fluid flow from a radiator system back to the housing;

a radiator system for receiving fluid that has been heated by the computing system that facilitates dissipating heat from the fluid; and a reservoir that is coupled via the pathway system to receive fluid from the radiator system that has been cooled and is coupled to supply the fluid that has been cooled to the housing.

14. The method of claim 12 wherein the step of responsive to the actuator speed being at least equal to the speed threshold, causing the computing system to be shut down further comprises:

causing an alert to be made that signifies a failure of the cooling system.

15. A cooling system comprising:

a linear actuator comprising:

a housing;

a moveable plunger within the housing comprising a piston at one end of the plunger that divides the housing into a first chamber and a second chamber;

a first inlet in the housing for receiving fluid that has been cooled into the first chamber of the housing;

a second inlet in the housing for receiving fluid that has been cooled into the second chamber of the housing;

a first outlet in the housing for providing an outlet of the fluid from the first chamber toward a device to be cooled;

a second outlet in the housing for providing an outlet of the fluid from the second chamber toward the device to be cooled;

a motive component for moving the piston in a first direction and a second direction; and a controller for controlling the motive component;

a pathway system that:

facilitates fluid flow from the first and second chambers of the housing across at least part of the device to be cooled to allow the fluid to absorb heat from the device; and facilitates fluid flow from a radiator system back to the housing;

a radiator system for receiving fluid that has been heated by the device that facilitates dissipating heat from the fluid; and a reservoir that is coupled via the pathway system to receive fluid from the radiator system that has been cooled and is coupled to supply the fluid that has been cooled to the housing.

16. The cooling system of claim 15 wherein:

the first inlet and the second inlet each comprises a valve;

the first outlet and the second outlet each comprises a valve; or the first inlet, the second inlet, the first outlet, and the second outlet each comprise a valve;

wherein one or more of the valves are controlled by the controller to direct the fluid to exit one chamber and fill the other chamber.

17. The cooling system of claim 15 wherein the piston is configured to block the first inlet or the second outlet for at least part of a first travel when it is moved in one direction and to block the second inlet or the first outlet for at least part of a second travel when it is moved in an opposite direction to direct the fluid to exit one chamber and fill the other chamber.

18. The cooling system of claim 15 further comprising a spring that exerts force upon the plunger or piston that causes, responsive to a failure of the motive component, the controller, or both, the plunger to be moved to a position that allows cooled fluid to flow through the first chamber, the second chamber, or both.

* * * * *